US009741918B2

United States Patent
Yohannes et al.

(10) Patent No.: US 9,741,918 B2
(45) Date of Patent: Aug. 22, 2017

(54) METHOD FOR INCREASING THE INTEGRATION LEVEL OF SUPERCONDUCTING ELECTRONICS CIRCUITS, AND A RESULTING CIRCUIT

(71) Applicant: Hypres Inc., Elmsford, NY (US)

(72) Inventors: Daniel Yohannes, Stamford, NY (US); Alexander F. Kirichenko, Pleasantville, NY (US); John Vivalda, Poughkeepsie, NY (US); Richard Hunt, Park Ridge, NJ (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 14/508,514

(22) Filed: Oct. 7, 2014

(65) Prior Publication Data

US 2015/0119253 A1    Apr. 30, 2015

Related U.S. Application Data

(60) Provisional application No. 61/887,919, filed on Oct. 7, 2013.

(51) Int. Cl.
*H01L 39/22* (2006.01)
*H01L 39/02* (2006.01)
(Continued)

(52) U.S. Cl.
CPC ............ *H01L 39/223* (2013.01); *H01L 27/18* (2013.01); *H01L 39/025* (2013.01); *H01L 39/2406* (2013.01); *H01L 39/2493* (2013.01)

(58) Field of Classification Search
CPC ............... H01L 21/0237; H01L 23/367; H01L 23/3677; H01L 23/3736; H01L 24/64;
(Continued)

(56) References Cited

U.S. PATENT DOCUMENTS

| 4,075,756 A | 2/1978 | Kircher et al. |
| 4,418,095 A | 11/1983 | Young et al. |

(Continued)

OTHER PUBLICATIONS

Tetsuro Satoh, "Planarization Process for Fabricating Multi-Layer Nb Integrated Circuits Incorporating Top Active Layer", vol. 19, No. 3, Jun. 2009, p. 1-4.*

(Continued)

*Primary Examiner* — Marc Armand
*Assistant Examiner* — Quinton Brasfield
(74) *Attorney, Agent, or Firm* — Steven M. Hoffberg, Esq.; Ostrolenk Faber LLP

(57) ABSTRACT

A method for increasing the integration level of superconducting electronic circuits, comprising fabricating a series of planarized electrically conductive layers patterned into wiring, separated by planarized insulating layers, with vias communicating between the conductive layers. Contrary to the standard sequence of patterning from the bottom up, the pattern of vias in at least one insulating layer is formed prior to the pattern of wiring in the underlying conductive layer. This enables a reduction in the number of planarization steps, leading to a fabrication process which is faster and more reliable. In a preferred embodiment, the superconductor is niobium and the insulator is silicon dioxide. This method can provide 10 or more wiring layers in a complex integrated circuit, and is compatible with non-planarized circuits placed above the planarized wiring layers.

23 Claims, 26 Drawing Sheets

Cross-sectional view of a RIPPLE-7 process

(51) Int. Cl.
  *H01L 27/18* (2006.01)
  *H01L 39/24* (2006.01)

(58) Field of Classification Search
  CPC .. H01L 25/0657; H01L 2924/14; H01L 33/20
  See application file for complete search history.

(56) References Cited

U.S. PATENT DOCUMENTS

| | | | |
|---|---|---|---|
| 4,437,227 A | 3/1984 | Flannery et al. |
| 4,448,800 A | 5/1984 | Ehara et al. |
| 4,456,506 A | 6/1984 | Stein et al. |
| 4,486,464 A | 12/1984 | Young |
| 4,533,624 A | 8/1985 | Sheppard |
| 4,837,604 A | 6/1989 | Faris |
| 4,904,619 A | 2/1990 | Yamada et al. |
| 5,049,543 A | 9/1991 | Van Der Kolk et al. |
| 5,055,158 A | 10/1991 | Gallagher et al. |
| 5,059,448 A | 10/1991 | Chandra et al. |
| 5,063,267 A | 11/1991 | Hanneman et al. |
| 5,091,162 A | 2/1992 | Frye et al. |
| 5,104,848 A | 4/1992 | Miedema et al. |
| 5,118,530 A | 6/1992 | Hanneman et al. |
| 5,173,620 A | 12/1992 | Fujimaki et al. |
| 5,229,360 A | 7/1993 | Shiga et al. |
| 5,246,782 A | 9/1993 | Kennedy et al. |
| 5,246,885 A | 9/1993 | Braren et al. |
| 5,256,636 A | 10/1993 | Wellstood et al. |
| 5,262,201 A | 11/1993 | Chandra et al. |
| 5,276,639 A | 1/1994 | Inoue |
| 5,291,035 A | 3/1994 | Wellstood et al. |
| 5,298,875 A | 3/1994 | Laibowitz et al. |
| 5,322,817 A | 6/1994 | James et al. |
| 5,326,988 A | 7/1994 | Ishida |
| 5,347,086 A | 9/1994 | Potter et al. |
| 5,365,476 A | 11/1994 | Mukhanov |
| 5,388,068 A | 2/1995 | Ghoshal et al. |
| 5,399,546 A | 3/1995 | Nakamura et al. |
| 5,407,903 A | 4/1995 | Nakamura et al. |
| 5,409,777 A | 4/1995 | Kennedy et al. |
| 5,413,982 A | 5/1995 | Inada et al. |
| 5,434,127 A | 7/1995 | Nakamura et al. |
| 5,436,029 A | 7/1995 | Ballance et al. |
| 5,439,875 A | 8/1995 | Tanaka et al. |
| 5,462,918 A | 10/1995 | Nakamura et al. |
| 5,462,919 A | 10/1995 | Tanaka et al. |
| 5,471,069 A | 11/1995 | Nakamura et al. |
| 5,476,719 A | 12/1995 | Sandell et al. |
| 5,477,061 A | 12/1995 | Morohashi |
| 5,494,891 A | 2/1996 | Nakamura et al. |
| 5,506,197 A | 4/1996 | Nakamura et al. |
| 5,523,686 A | 6/1996 | Kirtley et al. |
| 5,529,524 A | 6/1996 | Jones |
| 5,539,215 A | 7/1996 | Nakamura et al. |
| 5,548,181 A | 8/1996 | Jones |
| 5,565,695 A | 10/1996 | Johnson |
| 5,566,045 A | 10/1996 | Summerfelt et al. |
| 5,574,290 A | 11/1996 | You |
| 5,576,928 A | 11/1996 | Summerfelt et al. |
| 5,581,436 A | 12/1996 | Summerfelt et al. |
| 5,587,623 A | 12/1996 | Jones |
| 5,609,925 A | 3/1997 | Camilletti et al. |
| 5,619,097 A | 4/1997 | Jones |
| 5,619,393 A | 4/1997 | Summerfelt et al. |
| 5,621,223 A | 4/1997 | Nakamura et al. |
| 5,625,290 A | 4/1997 | You |
| 5,629,838 A | 5/1997 | Knight et al. |
| 5,637,555 A | 6/1997 | Nakamura et al. |
| 5,689,087 A | 11/1997 | Jack |
| 5,710,437 A | 1/1998 | Kurakado et al. |
| 5,717,222 A | 2/1998 | Nakamura et al. |
| 5,730,922 A | 3/1998 | Babb et al. |
| 5,736,456 A | 4/1998 | Akram |
| 5,739,084 A | 4/1998 | Nakamura et al. |
| 5,742,459 A | 4/1998 | Shen et al. |
| 5,750,474 A | 5/1998 | Sung et al. |
| 5,753,014 A | 5/1998 | Van Rijn |
| 5,764,567 A | 6/1998 | Parkin |
| 5,776,863 A | 7/1998 | Silver |
| 5,786,690 A | 7/1998 | Kirtley et al. |
| 5,789,346 A | 8/1998 | Nakamura et al. |
| 5,801,393 A | 9/1998 | Sung et al. |
| 5,801,984 A | 9/1998 | Parkin |
| 5,818,373 A | 10/1998 | Semenov et al. |
| 5,820,923 A | 10/1998 | Ballance et al. |
| 5,840,204 A | 11/1998 | Inada et al. |
| 5,853,808 A | 12/1998 | Arkles et al. |
| 5,854,492 A | 12/1998 | Chinone et al. |
| 5,903,058 A | 5/1999 | Akram |
| 5,912,503 A | 6/1999 | Chan et al. |
| 5,923,970 A | 7/1999 | Kirlin |
| 6,016,000 A | 1/2000 | Moslehi |
| 6,023,072 A | 2/2000 | Silver |
| 6,051,440 A | 4/2000 | Chan et al. |
| 6,051,846 A | 4/2000 | Burns et al. |
| 6,072,689 A | 6/2000 | Kirlin |
| 6,110,278 A | 8/2000 | Saxena |
| 6,110,392 A | 8/2000 | Kerber et al. |
| 6,124,198 A | 9/2000 | Moslehi |
| 6,157,329 A | 12/2000 | Lee et al. |
| 6,165,801 A | 12/2000 | Burns et al. |
| 6,190,998 B1 | 2/2001 | Bruel et al. |
| 6,191,073 B1 | 2/2001 | Hojczyk et al. |
| 6,285,050 B1 | 9/2001 | Emma et al. |
| 6,306,729 B1 | 10/2001 | Sakaguchi et al. |
| 6,384,423 B1 | 5/2002 | Kerber et al. |
| 6,420,251 B1 | 7/2002 | Elmadjian et al. |
| 6,429,095 B1 | 8/2002 | Sakaguchi et al. |
| 6,517,944 B1 | 2/2003 | Puzey et al. |
| 6,528,814 B1 | 3/2003 | Frank et al. |
| 6,593,212 B1 | 7/2003 | Kub et al. |
| 6,600,638 B2 | 7/2003 | Gill |
| 6,604,270 B2 | 8/2003 | Kincaid et al. |
| 6,623,355 B2 | 9/2003 | McClain et al. |
| 6,624,047 B1 | 9/2003 | Sakaguchi et al. |
| 6,642,608 B1 | 11/2003 | Hu |
| 6,717,845 B2 | 4/2004 | Saito et al. |
| 6,728,113 B1 | 4/2004 | Knight et al. |
| 6,743,078 B2 | 6/2004 | McClain et al. |
| 6,777,036 B2 | 8/2004 | Bravo Vasquez et al. |
| 6,804,146 B2 | 10/2004 | Johnson |
| 6,807,090 B2 | 10/2004 | Johnson |
| 6,807,094 B2 | 10/2004 | Saito et al. |
| 6,809,959 B2 | 10/2004 | Johnson |
| 6,825,106 B1 | 11/2004 | Gao et al. |
| 6,849,469 B1 | 2/2005 | Thuruthiyil et al. |
| 6,852,167 B2 | 2/2005 | Ahn |
| 6,870,761 B2 | 3/2005 | Johnson |
| 6,911,665 B2 | 6/2005 | Aoyagi et al. |
| 6,916,719 B1 | 7/2005 | Knight et al. |
| 6,926,921 B2 | 8/2005 | Stasiak et al. |
| 6,946,597 B2 | 9/2005 | Sager et al. |
| 6,967,154 B2 | 11/2005 | Meng et al. |
| 6,975,533 B2 | 12/2005 | Johnson |
| 6,992,344 B2 | 1/2006 | Coolbaugh et al. |
| 7,019,391 B2 | 3/2006 | Tran |
| 7,042,004 B2 | 5/2006 | Magnus et al. |
| 7,042,035 B2 | 5/2006 | Rinerson et al. |
| 7,050,329 B2 | 5/2006 | Johnson |
| 7,064,976 B2 | 6/2006 | Johnson |
| 7,068,535 B2 | 6/2006 | Johnson |
| 7,081,417 B2 | 7/2006 | Hinode et al. |
| 7,106,159 B2 | 9/2006 | Delamare et al. |
| 7,115,218 B2 | 10/2006 | Kydd et al. |
| 7,129,552 B2 | 10/2006 | Gao et al. |
| 7,142,078 B2 | 11/2006 | Rostaing et al. |
| 7,160,577 B2 | 1/2007 | Ahn et al. |
| 7,161,112 B2 | 1/2007 | Smith et al. |
| 7,166,816 B1 | 1/2007 | Chen et al. |
| 7,215,570 B2 | 5/2007 | Johnson |
| 7,229,745 B2 | 6/2007 | Lamarre |
| 7,235,424 B2 | 6/2007 | Chen et al. |
| 7,259,434 B2 | 8/2007 | Ahn et al. |
| 7,269,059 B2 | 9/2007 | Morise et al. |
| 7,279,686 B2 | 10/2007 | Schneiker |

(56) References Cited

U.S. PATENT DOCUMENTS

| | | |
|---|---|---|
| 7,279,732 B2 | 10/2007 | Meng et al. |
| 7,311,944 B2 | 12/2007 | Sambasivan et al. |
| 7,319,069 B2 | 1/2008 | Den et al. |
| 7,323,348 B2 | 1/2008 | Aoyagi et al. |
| 7,330,369 B2 | 2/2008 | Tran |
| 7,338,907 B2 | 3/2008 | Li et al. |
| 7,339,819 B2 | 3/2008 | Johnson |
| 7,371,698 B2 | 5/2008 | Moriya et al. |
| 7,375,417 B2 | 5/2008 | Tran |
| 7,393,699 B2 | 7/2008 | Tran |
| 7,396,741 B2 | 7/2008 | Mund et al. |
| 7,397,060 B2 | 7/2008 | Lung |
| 7,410,668 B2 | 8/2008 | Ahn |
| 7,456,421 B2 | 11/2008 | Lung |
| 7,463,512 B2 | 12/2008 | Lung |
| 7,473,576 B2 | 1/2009 | Lung |
| 7,476,587 B2 | 1/2009 | Lung |
| 7,489,537 B2 | 2/2009 | Tran |
| 7,505,310 B2 | 3/2009 | Nagasawa et al. |
| 7,507,519 B2 | 3/2009 | Toyoda |
| 7,510,664 B2 | 3/2009 | Carr |
| 7,514,367 B2 | 4/2009 | Lung et al. |
| 7,527,985 B2 | 5/2009 | Lai et al. |
| 7,534,647 B2 | 5/2009 | Lung |
| 7,535,035 B2 | 5/2009 | Baek et al. |
| 7,541,198 B2 | 6/2009 | Magnus et al. |
| 7,541,263 B2 | 6/2009 | Moriceau et al. |
| 7,541,558 B2 | 6/2009 | Smith et al. |
| 7,554,144 B2 | 6/2009 | Lai et al. |
| 7,554,161 B2 | 6/2009 | Ahn et al. |
| 7,560,337 B2 | 7/2009 | Ho et al. |
| 7,569,844 B2 | 8/2009 | Lung |
| 7,595,218 B2 | 9/2009 | Ho et al. |
| 7,605,079 B2 | 10/2009 | Lai et al. |
| 7,630,227 B2 | 12/2009 | Tran |
| 7,638,359 B2 | 12/2009 | Lung |
| 7,642,539 B2 | 1/2010 | Lung |
| 7,646,570 B2 | 1/2010 | Gill et al. |
| 7,670,646 B2 | 3/2010 | Ahn et al. |
| 7,682,868 B2 | 3/2010 | Lung |
| 7,687,938 B2 | 3/2010 | Bunyk et al. |
| 7,696,506 B2 | 4/2010 | Lung |
| 7,697,316 B2 | 4/2010 | Lai et al. |
| 7,732,003 B2 | 6/2010 | Toyoda |
| 7,732,800 B2 | 6/2010 | Lai et al. |
| 7,741,636 B2 | 6/2010 | Ho |
| 7,749,854 B2 | 7/2010 | Lung |
| 7,755,076 B2 | 7/2010 | Lung |
| 7,759,747 B2 | 7/2010 | Forbes et al. |
| 7,786,461 B2 | 8/2010 | Lung |
| 7,816,661 B2 | 10/2010 | Lai et al. |
| 7,820,997 B2 | 10/2010 | Lai et al. |
| 7,821,747 B2 | 10/2010 | Gill |
| 7,852,106 B2 | 12/2010 | Herr et al. |
| 7,864,560 B2 | 1/2011 | Tran |
| 7,868,539 B2 | 1/2011 | Ohara |
| 7,869,221 B2 | 1/2011 | Knight et al. |
| 7,870,087 B2 | 1/2011 | Macready et al. |
| 7,872,291 B2 | 1/2011 | Meng et al. |
| 7,875,493 B2 | 1/2011 | Lung |
| 7,879,645 B2 | 2/2011 | Lung et al. |
| 7,884,342 B2 | 2/2011 | Lung |
| 7,902,038 B2 | 3/2011 | Aspar et al. |
| 7,932,129 B2 | 4/2011 | Lung |
| 7,956,344 B2 | 6/2011 | Lung |
| 7,972,893 B2 | 7/2011 | Lai et al. |
| 7,984,012 B2 | 7/2011 | Coury et al. |
| 8,003,410 B2 | 8/2011 | Kerner et al. |
| 8,026,038 B2 | 9/2011 | Ogihara et al. |
| 8,032,474 B2 | 10/2011 | Macready et al. |
| 8,039,392 B2 | 10/2011 | Lai et al. |
| 8,055,318 B1 | 11/2011 | Kadin |
| 8,062,923 B2 | 11/2011 | Lung |
| 8,076,242 B2 | 12/2011 | Kim et al. |
| 8,080,440 B2 | 12/2011 | Lai et al. |
| 8,084,762 B2 | 12/2011 | Tran |
| 8,106,376 B2 | 1/2012 | Lai et al. |
| 8,110,456 B2 | 2/2012 | Lung |
| 8,111,541 B2 | 2/2012 | Lai et al. |
| 8,114,763 B2 | 2/2012 | Forbes et al. |
| 8,119,020 B2 | 2/2012 | Ito et al. |
| 8,124,426 B2 | 2/2012 | Gaidis |
| 8,124,906 B2 | 2/2012 | Holber et al. |
| 8,138,857 B2 | 3/2012 | Ding et al. |
| 8,143,150 B2 | 3/2012 | Jeong |
| 8,158,963 B2 | 4/2012 | Ho et al. |
| 8,168,291 B2 | 5/2012 | Shah et al. |
| 8,178,388 B2 | 5/2012 | Ho |
| 8,188,563 B2 | 5/2012 | Finkelstein et al. |
| 8,189,980 B2 | 5/2012 | Miyazaki et al. |
| 8,193,878 B2 | 6/2012 | Ding et al. |
| 8,211,833 B2 | 7/2012 | Gilbert et al. |
| 8,237,140 B2 | 8/2012 | Lung et al. |
| 8,237,148 B2 | 8/2012 | Lung |
| 8,244,662 B2 | 8/2012 | Coury et al. |
| 8,247,799 B2 | 8/2012 | Bunyk et al. |
| 8,253,320 B2 | 8/2012 | Nakanishi et al. |
| 8,301,214 B1* | 10/2012 | Tolpygo ............. H01L 39/2493 505/190 |
| 8,324,734 B2 | 12/2012 | Gaidis |
| 8,330,357 B2 | 12/2012 | Ohara |
| 8,339,030 B2 | 12/2012 | Nakanishi et al. |
| 8,362,576 B2 | 1/2013 | Meng et al. |
| 8,383,929 B2 | 2/2013 | Milshtein et al. |
| 8,384,060 B2 | 2/2013 | Ryoo et al. |
| 8,404,620 B2 | 3/2013 | Gilbert et al. |
| 8,437,818 B1 | 5/2013 | Tolpygo et al. |
| 8,450,716 B2 | 5/2013 | Tran |
| 8,476,988 B2 | 7/2013 | Ding et al. |
| 8,508,314 B2 | 8/2013 | Ding et al. |
| 8,513,637 B2 | 8/2013 | Lung |
| 8,536,566 B2 | 9/2013 | Johansson et al. |
| 8,571,614 B1 | 10/2013 | Mukhanov et al. |
| 8,609,593 B2 | 12/2013 | Gilbert et al. |
| 8,653,497 B2 | 2/2014 | Tran |
| 8,759,257 B2 | 6/2014 | Gilbert et al. |
| 8,796,181 B2 | 8/2014 | Gilbert et al. |
| 8,951,808 B2 | 2/2015 | Ladizinsky et al. |
| 9,130,116 B1 | 9/2015 | Tolpygo et al. |
| 2002/0055323 A1 | 5/2002 | McClain et al. |
| 2002/0068419 A1 | 6/2002 | Sakaguchi et al. |
| 2002/0148560 A1 | 10/2002 | Carr |
| 2002/0197415 A1 | 12/2002 | Bravo Vasquez et al. |
| 2003/0183935 A1* | 10/2003 | Herr ................. H01L 27/18 257/758 |
| 2003/0194953 A1 | 10/2003 | McClain et al. |
| 2004/0053079 A1 | 3/2004 | Horibe et al. |
| 2004/0056335 A1 | 3/2004 | Aoyagi et al. |
| 2004/0061229 A1 | 4/2004 | Moslehi |
| 2004/0069991 A1 | 4/2004 | Dunn et al. |
| 2004/0071019 A1 | 4/2004 | Magnus et al. |
| 2004/0081751 A1 | 4/2004 | Nakanishi et al. |
| 2004/0151893 A1 | 8/2004 | Kydd et al. |
| 2004/0159869 A1 | 8/2004 | Rinerson et al. |
| 2004/0206267 A1 | 10/2004 | Sambasivan et al. |
| 2004/0222500 A1 | 11/2004 | Aspar et al. |
| 2004/0266209 A1 | 12/2004 | Hinode et al. |
| 2005/0002448 A1 | 1/2005 | Knight et al. |
| 2005/0042430 A1 | 2/2005 | Toyoda |
| 2005/0058840 A1 | 3/2005 | Toyoda |
| 2005/0092929 A1 | 5/2005 | Schneiker |
| 2005/0121068 A1 | 6/2005 | Sager et al. |
| 2005/0123674 A1 | 6/2005 | Stasiak et al. |
| 2005/0149002 A1 | 7/2005 | Wang et al. |
| 2005/0149169 A1 | 7/2005 | Wang et al. |
| 2005/0182482 A1 | 8/2005 | Wang et al. |
| 2005/0191763 A1 | 9/2005 | Aoyagi et al. |
| 2005/0197254 A1 | 9/2005 | Stasiak et al. |
| 2005/0218397 A1 | 10/2005 | Tran |
| 2005/0218398 A1 | 10/2005 | Tran |
| 2005/0230822 A1 | 10/2005 | Tran |
| 2005/0231855 A1 | 10/2005 | Tran |
| 2005/0237140 A1 | 10/2005 | Rostaing et al. |
| 2005/0240100 A1 | 10/2005 | Wang et al. |

(56) References Cited

U.S. PATENT DOCUMENTS

| | | |
|---|---|---|
| 2005/0244337 A1 | 11/2005 | Wang et al. |
| 2005/0261763 A1 | 11/2005 | Wang et al. |
| 2005/0267000 A1 | 12/2005 | Kerber |
| 2005/0277064 A1 | 12/2005 | Lamarre |
| 2005/0278020 A1 | 12/2005 | Wang et al. |
| 2006/0030074 A1 | 2/2006 | Mund et al. |
| 2006/0073706 A1 | 4/2006 | Li et al. |
| 2006/0097288 A1 | 5/2006 | Baek et al. |
| 2006/0138394 A1 | 6/2006 | Den et al. |
| 2006/0142853 A1 | 6/2006 | Wang et al. |
| 2006/0145326 A1 | 7/2006 | Tran |
| 2006/0162497 A1 | 7/2006 | Kodas et al. |
| 2006/0165898 A1 | 7/2006 | Kodas et al. |
| 2006/0165910 A1 | 7/2006 | Kodas et al. |
| 2006/0166057 A1 | 7/2006 | Kodas et al. |
| 2006/0255987 A1 | 11/2006 | Nagasawa et al. |
| 2006/0260674 A1 | 11/2006 | Tran |
| 2006/0264069 A1 | 11/2006 | Magnus et al. |
| 2006/0270082 A1 | 11/2006 | Moriya et al. |
| 2006/0284158 A1 | 12/2006 | Lung et al. |
| 2006/0286743 A1 | 12/2006 | Lung et al. |
| 2007/0108429 A1 | 5/2007 | Lung |
| 2007/0131922 A1 | 6/2007 | Lung |
| 2007/0138458 A1 | 6/2007 | Lung |
| 2007/0155172 A1 | 7/2007 | Lai et al. |
| 2007/0158690 A1 | 7/2007 | Ho et al. |
| 2007/0161186 A1 | 7/2007 | Ho |
| 2007/0173019 A1 | 7/2007 | Ho et al. |
| 2007/0176261 A1 | 8/2007 | Lung |
| 2007/0194225 A1 | 8/2007 | Zorn |
| 2007/0241371 A1 | 10/2007 | Lai et al. |
| 2007/0259528 A1 | 11/2007 | Moriceau et al. |
| 2007/0278529 A1 | 12/2007 | Lai et al. |
| 2007/0281420 A1 | 12/2007 | Lai et al. |
| 2007/0285843 A1 | 12/2007 | Tran |
| 2007/0298535 A1 | 12/2007 | Lung |
| 2008/0023442 A1 | 1/2008 | Ito et al. |
| 2008/0060947 A1 | 3/2008 | Kitsuka et al. |
| 2008/0070325 A1* | 3/2008 | Tolpygo ............ H01L 39/2493 438/2 |
| 2008/0096341 A1 | 4/2008 | Lai et al. |
| 2008/0106923 A1 | 5/2008 | Lung |
| 2008/0116449 A1 | 5/2008 | Macready et al. |
| 2008/0135824 A1 | 6/2008 | Lai et al. |
| 2008/0138929 A1 | 6/2008 | Lung |
| 2008/0138930 A1 | 6/2008 | Lung |
| 2008/0138931 A1 | 6/2008 | Lung |
| 2008/0150422 A1 | 6/2008 | Ohara |
| 2008/0173931 A1 | 7/2008 | Ho et al. |
| 2008/0192534 A1 | 8/2008 | Lung |
| 2008/0203375 A1 | 8/2008 | Lung |
| 2008/0217648 A1 | 9/2008 | Ohara |
| 2008/0218519 A1 | 9/2008 | Coury et al. |
| 2008/0239791 A1 | 10/2008 | Tran |
| 2008/0246014 A1 | 10/2008 | Lung |
| 2008/0247224 A1 | 10/2008 | Lung |
| 2008/0258126 A1 | 10/2008 | Lung |
| 2008/0259672 A1 | 10/2008 | Lung |
| 2008/0266940 A1 | 10/2008 | Lai et al. |
| 2008/0277766 A1 | 11/2008 | Cantor et al. |
| 2008/0315978 A1 | 12/2008 | Knight et al. |
| 2009/0008632 A1 | 1/2009 | Bunyk et al. |
| 2009/0014706 A1 | 1/2009 | Lung |
| 2009/0032796 A1 | 2/2009 | Lung |
| 2009/0042335 A1 | 2/2009 | Lung |
| 2009/0079494 A1 | 3/2009 | Kerner et al. |
| 2009/0098716 A1 | 4/2009 | Lung |
| 2009/0101883 A1 | 4/2009 | Lai et al. |
| 2009/0102369 A1 | 4/2009 | Nakanishi et al. |
| 2009/0104771 A1 | 4/2009 | Lung |
| 2009/0116277 A1 | 5/2009 | Tran |
| 2009/0189138 A1 | 7/2009 | Lung et al. |
| 2009/0230376 A1 | 9/2009 | Ryoo et al. |
| 2009/0230378 A1 | 9/2009 | Ryoo et al. |
| 2009/0236743 A1 | 9/2009 | Ho et al. |
| 2009/0239358 A1 | 9/2009 | Lai et al. |
| 2009/0295510 A1 | 12/2009 | Miyazaki et al. |
| 2010/0012167 A1 | 1/2010 | Milshtein et al. |
| 2010/0012353 A1 | 1/2010 | Milshtein et al. |
| 2010/0068878 A1 | 3/2010 | Lung |
| 2010/0073995 A1 | 3/2010 | Tran |
| 2010/0133514 A1 | 6/2010 | Bunyk et al. |
| 2010/0178825 A1 | 7/2010 | Shah et al. |
| 2010/0207095 A1 | 8/2010 | Lai et al. |
| 2010/0216279 A1 | 8/2010 | Lai et al. |
| 2010/0221888 A1 | 9/2010 | Ho |
| 2010/0237316 A1 | 9/2010 | Lung |
| 2010/0279000 A1 | 11/2010 | Sambasivan et al. |
| 2010/0297824 A1 | 11/2010 | Lung |
| 2011/0012084 A1 | 1/2011 | Lai et al. |
| 2011/0024409 A1 | 2/2011 | Shah et al. |
| 2011/0057169 A1 | 3/2011 | Harris et al. |
| 2011/0060711 A1 | 3/2011 | Macready et al. |
| 2011/0076825 A1 | 3/2011 | Lung |
| 2011/0079817 A1 | 4/2011 | Ohara |
| 2011/0089405 A1 | 4/2011 | Ladizinsky et al. |
| 2011/0110141 A1 | 5/2011 | Tran |
| 2011/0124483 A1 | 5/2011 | Shah et al. |
| 2011/0136282 A1 | 6/2011 | Shirasawa et al. |
| 2011/0163455 A1 | 7/2011 | Gaidis |
| 2011/0168089 A1 | 7/2011 | Shah et al. |
| 2011/0174519 A1 | 7/2011 | Shah et al. |
| 2011/0186775 A1 | 8/2011 | Shah et al. |
| 2011/0207289 A1 | 8/2011 | Jeong |
| 2011/0238607 A1 | 9/2011 | Coury et al. |
| 2012/0000691 A1 | 1/2012 | Shah et al. |
| 2012/0012833 A1 | 1/2012 | Shirasawa et al. |
| 2012/0012870 A1 | 1/2012 | Nakanishi et al. |
| 2012/0012897 A1 | 1/2012 | Besser et al. |
| 2012/0091429 A1 | 4/2012 | Tran |
| 2012/0133050 A1 | 5/2012 | Gaidis |
| 2012/0164429 A1 | 6/2012 | Shah et al. |
| 2012/0263935 A1 | 10/2012 | Ledford et al. |
| 2012/0299175 A1 | 11/2012 | Tran |
| 2013/0043452 A1 | 2/2013 | Meyer et al. |
| 2013/0076231 A1 | 3/2013 | Nakanishi et al. |
| 2013/0082232 A1 | 4/2013 | Wu et al. |
| 2013/0083443 A1 | 4/2013 | Edwards |
| 2013/0096825 A1 | 4/2013 | Mohanty |
| 2013/0163310 A1 | 6/2013 | Tran |
| 2013/0196856 A1 | 8/2013 | Li et al. |
| 2013/0200429 A1 | 8/2013 | Pan |
| 2013/0313526 A1 | 11/2013 | Harris et al. |
| 2014/0126269 A1 | 5/2014 | Tran |
| 2015/0119252 A1 | 4/2015 | Ladizinsky et al. |
| 2015/0119253 A1 | 4/2015 | Yohannes et al. |
| 2015/0143817 A1 | 5/2015 | Gervais et al. |
| 2015/0187840 A1 | 7/2015 | Ladizinsky et al. |

OTHER PUBLICATIONS

Tetsuro Satoh, "Planarization Process for Fabricating Multi-Layer Nb Integrated Circuits Incorporating Top Active Layer", vol. 19, No. 3, Jun. 2009, p. 1 -4.*

Sergey Tolpygo, "Deep sub-micron stud-via technology for superconducting VLSI Circuits" Lincoln Laboratory, Sep. 2013, pp. 1-13.*

Tolpygo, Sergey K., et al. "Deep sub-micron stud-via technology of superconductor VLSI circuits." Superconductor Science and Technology 27.2 (2014): 025016.

Tolpygo, Sergey K., et al. "Fabrication Process and Properties of Fully-Planarized Deep-Submicron Nb/Al-AlOx/Nb Josephson Junctions for VLSI Circuits." arXiv preprint arXiv:1408.5829 (2014).

Tolpygo, Sergey K., et al. "20 Process Development for Superconducting Integrated Circuits With 80 GHz Clock Frequency." Applied Superconductivity, IEEE Transactions on 17.2 (2007): 946-951.

Silver, A., et al. "Development of superconductor electronics technology for high-end computing." Superconductor Science and Technology 16.12 (2003): 1368.

(56) References Cited

OTHER PUBLICATIONS

Satoh, Tetsuro, et al. "Fabrication process of planarized multi-layer Nb integrated circuits." Applied Superconductivity, IEEE Transactions on 15.2 (2005): 78-81.
Numata, Hideaki et al, "Fabrication Technology for Nb Integrated Circuits," LEICE Trans. Electron, vol. E84-C, No. 1, Jan. 2001.
Nagasawa, S., et al. "Development of advanced Nb process for SFQ circuits." Physica C: Superconductivity 412 (2004): 1429-1436.
Nagasawa, Shuichi, et al. "Planarized multi-layer fabrication technology for LTS large-scale SFQ circuits." Superconductor Science and Technology 16.12 (2003): 1483.
Nagasawa, S., et al. "New Nb multi-layer fabrication process for large-scale SFQ circuits." Physica C: Superconductivity 469.15 (2009): 1578-1584.
Mitamura, Naoki, et al. "Suppression of Magnetic Flux Trapping by Moats formed in NbN Ground Planes." Applied physics express 4.1 (2011): 013102.
Ketchen, M. B., et al. "Sub-μm, planarized, Nb-AlOx-Nb Josephson process for 125 mm wafers developed in partnership with Si technology." Applied physics letters 59.20 (1991): 2609-2611.
Hidaka, Mutsuo, et al. "Improvements in fabrication process for Nb-based single flux quantum circuits in Japan." IEICE transactions on electronics 91.3 (2008): 318-324.
Imamura, Takeshi, Tetsuyoshi Shiota, and Shinya Hasuo. "Fabrication of high quality Nb/AlO/sub x/-Al/Nb Josephson junctions. I. Sputtered Nb films for junction electrodes." Applied Superconductivity, IEEE Transactions on 2.1 (1992): 1-14.
Bunyk, Paul, Konstantin Likharev, and Dmitry Zinoviev. "RSFQ technology: Physics and devices." International journal of high speed electronics and systems 11.01 (2001): 257-305.
Likharev, Konstantin K., and Vasilii K. Semenov. "RSFQ logic/memory family: A new Josephson junction technology for sub-terahertz-clock-frequency digital systems." Applied Superconductivity, IEEE Transactions on 1.1 (1991): 3-28.
Kirichenko, Alex F., et al. "Demonstration of an 8×8-bit RSFQ multi-port register file." Superconductive Electronics Conference (ISEC), 2013 IEEE 14th International. IEEE, 2013.
Göpel, Wolfgang, and Klaus Dieter Schierbaum. "SnO< sub>2</sub> sensors: current status and future prospects." Sensors and Actuators B: Chemical 26.1 (1995): 1-12.
Hulteen, John C., and Richard P. Van Duyne. "Nanosphere lithography: a materials general fabrication process for periodic particle array surfaces." Journal of Vacuum Science & Technology A 13.3 (1995): 1553-1558.

Brock, Darren et al, "Retargeting RSFQ Cells to a Submicron Fabrication Process," IEEE Transactions on Applied Superconductivity, vol. 11, No. 1, Mar. 2001.
Abelson, Lynn A., and George L. Kerber. "Superconductor integrated circuit fabrication technology." Proceedings of the IEEE 92.10 (2004): 1517-1533.
Ortlep, T. "Recent progress in superconductive digital electronics part II—Japanese contributions." IEEE/CSC & ESAS European Superconductivity News Forum. No. 5. 2008.
Satoh, Tetsuro. "Superconductivity Web21." Feb. 2014, Published by International Superconductivity Technology Center KSP, Kawasaki, Kanagawa 213-0012 Japan.
Luo, W. A., et al. "Two-layer, planar, superconducting multichip module technology." SPIE proceedings series. Society of Photo-Optical Instrumentation Engineers, 2000.
Gallagher, William J., Erik P. Harris, and Mark B. Ketchen. "Superconductivity at IBM—a Centenial Review: Part I—Superconducting Computer and Device Applications." (2012).
Khapaev, Mikhail M. "3D-π LS © Software package for inductance calculation in multilayer superconducting integrated circuits Mikhail M. Khapaev, Anna Yu. Kidiyarova-Shevchenko, Per Magnelind, Mikhail Yu. Kupriyanov Abstract—A new software package 3D-MLSI was devel."
Mattauch, R. J., W. L. Bishop, and A. W. Lichtenberger. "Recent results on: Surface-channel Schottky, InGaAs Schottky, and Nb based SIS mixer element research." Proc. First Int. Symp. Space THz. Technology. 1990.
Beasley, Malcolm R., and Richard W. Ralston. "Electronic Applications of Superconductivity in Japan." International Technology Research Institute, World Technology (WTEC) Division (1998).
Chen, W., et al. "Rapid single flux quantum T-flip flop operating up to 770 GHz." Applied Superconductivity, IEEE Transactions on 9.2 (1999): 3212-3215.
Tolpygo, Sergey K., et al. "Inductance of circuit structures for MIT LL superconductor electronics fabrication process with 8 niobium layers." Applied Superconductivity, IEEE Transactions on 25.3 (2015): 1-5.
Yohannes, Daniel T., et al. "Planarized, extendible, multilayer fabrication process for superconducting electronics." Applied Superconductivity, IEEE Transactions on 25.3 (2015): 1-5.
Tolpygo, Sergey K., et al. "Fabrication Process and Properties of Fully-Planarized Deep-Submicron Nb/Al—Josephson Junctions for VLSI Circuits." Applied Superconductivity, IEEE Transactions on 25.3 (2015): 1-12.

* cited by examiner

Cross-sectional view of a RIPPLE-7 process

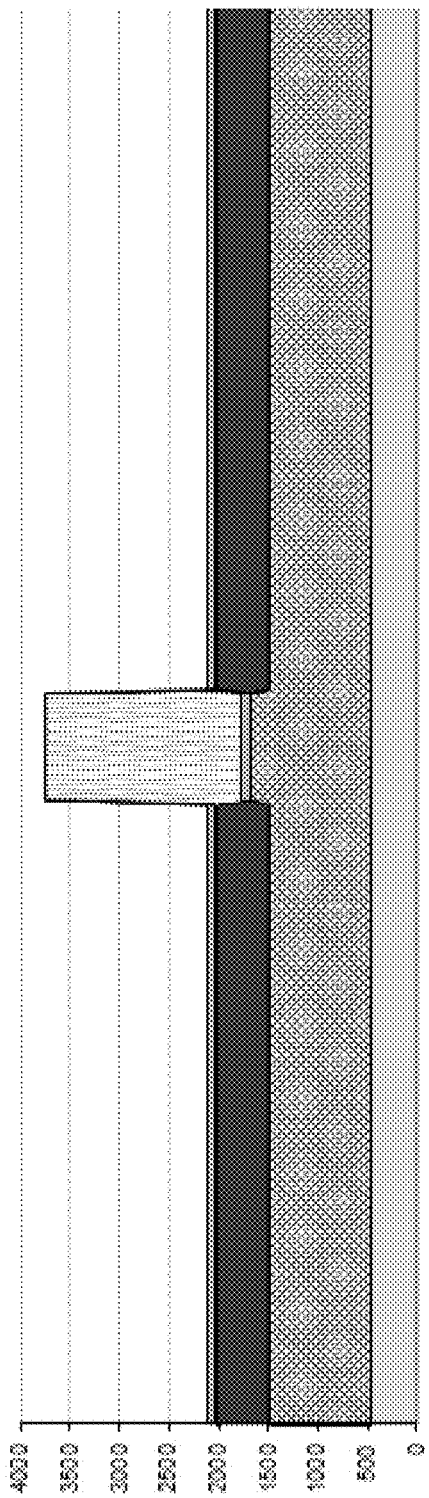
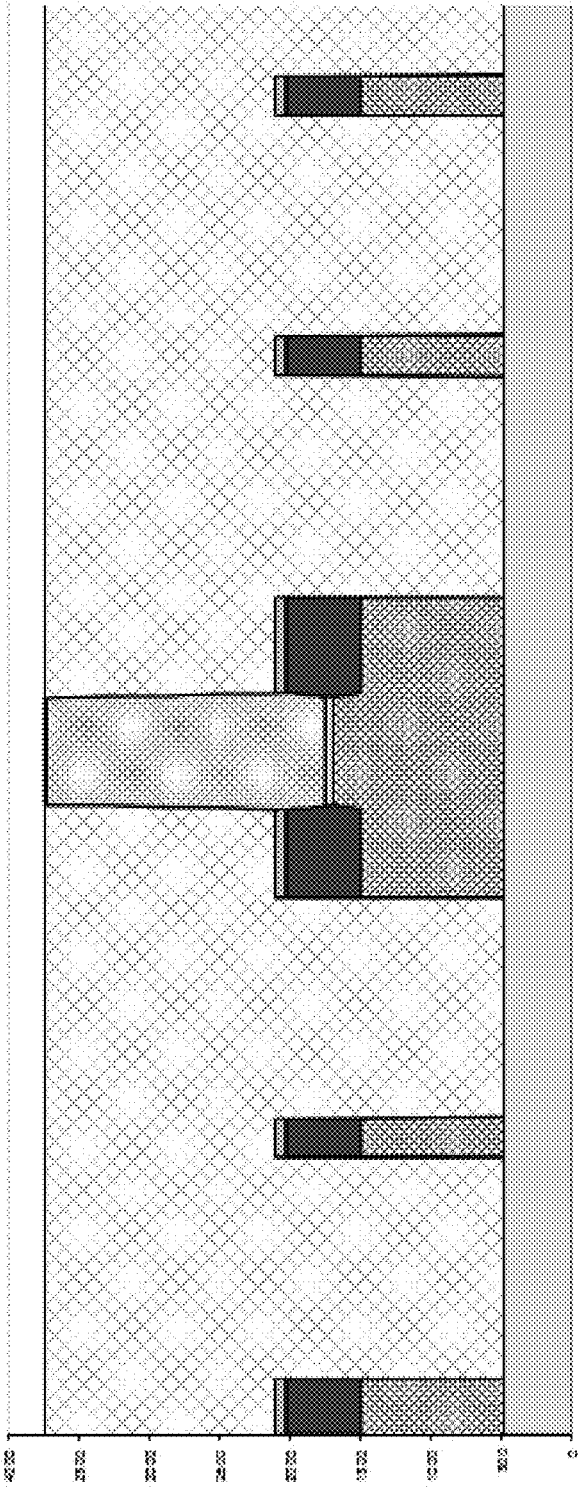
Fig. 21A
Fig. 21B

METHOD FOR INCREASING THE INTEGRATION LEVEL OF SUPERCONDUCTING ELECTRONICS CIRCUITS, AND A RESULTING CIRCUIT

CROSS REFERENCE TO RELATED APPLICATIONS

The present application is a non-provisional of, and claims benefit of priority under 35 U.S.C. §119(e) from, U.S. Provisional Patent Application No. 61/887,919, filed Oct. 7, 2013, the entirety of which is expressly incorporated herein by reference.

BACKGROUND OF THE INVENTION

Superconducting integrated circuits (ICs) based on Josephson junctions (JJs) are capable of operation with very low power and high speed, orders of magnitude beyond those possible using conventional semiconducting circuits. Recently, superconducting single flux quantum (SFQ) circuits have progressed to even lower power versions with zero-static power dissipation (Mukhanov, U.S. Pat. No. 8,571,614; Herr, U.S. Pat. No. 7,852,106), making them highly competitive for application in next generation energy-efficient computing systems. However, the practical realization of superconducting digital circuits for high-end computing requires a significant increase in circuit complexity and gate density. Conventional SFQ integrated circuit fabrication technology has been proven to deliver SFQ digital ICs with more than 10,000 JJs per die, using a fabrication process with just 4 superconducting niobium (Nb) layers and relatively coarse (1.0 µm) lithography with 1.5-2 µm minimum JJ size, without layer planarization. Further increase in integration density and scale of superconducting ICs requires finer lithography to reduce the size of all circuit components including JJs, vias, thin-film inductors, thin-film resistors, and interconnects. Note that this is a different application than superconducting quantum computing based on similar JJs, for which the required circuit complexity is significantly less, but the operating temperature is much lower (see, e.g., Ladizinsky, US20110089405).

The biggest gain in the IC integration scale can be achieved by adding more superconducting layers using layer planarization, which becomes essential to avoid problems associated with lines over edges. Hinode (U.S. Pat. No. 7,081,417) has demonstrated up to 10 Nb layers with submicron JJ size using planarization based on chemical mechanical polishing (CMP). CMP is generally the rate-limiting step in the overall process, and can also lead to contamination, given that it is a wet process that may generate particulate residues. Another known problem with CMP is that the layer planarization rate may depend on the detailed pattern and scale of the devices in a given layer, and may therefore vary within a layer and between layers. One solution to this problem is to incorporate standard dummy patterns in sparsely populated regions (see, e.g., Chen, U.S. Pat. No. 7,235,424). In contrast, Hinode developed a process without such dummy patterns, but using an inverted mask and etching to create a narrow standard "Caldera" (or crater edge) at all edges. Overall, this creates structures that are largely independent of pattern and scale, permitting control and uniformity of the CMP process.

In order to obtain the greatest increase in circuit density by adding superconducting layers, one needs stackable vias (or plugs) allowing connection between multiple metal layers with minimal parasitic inductance, while not compromising circuit area. This has been a difficult problem requiring the development of special fabrication techniques (e.g., Tolpygo, U.S. Pat. Nos. 8,301,214; 8,437,818).

In general, any fully planarized process requires one step of planarization (using, e.g., CMP) for each patternable layer. For example, consider a basic wiring bi-layer such as that shown in FIG. 25A, comprising a lower wiring layer and an upper insulating layer. The insulating layer must contain holes which are penetrated by conducting vias that can connect the lower wiring layer to other wiring layers above. A standard planarized process would comprise first patterning the metals and insulators in the bottom wiring layer, followed by a first planarization step leading to the intermediate structure in FIG. 25B. This would be followed by depositing and patterning the insulator and metal in the top insulator/via layer, followed by a second planarization step.

The art fails to provide a multi-layer planarization process that requires only a single step of chemical mechanical polishing for each wiring bi-layer.

Planarized superconducting circuit technology is discussed in:

Tolpygo, Sergey K., et al. "System and method for providing multi-conductive layer metallic interconnects for superconducting integrated circuits." U.S. Pat. No. 8,437,818, 7 May 2013.

Tolpygo, Sergey K., et al. "Deep Sub-Micron Stud-Via Technology for Superconductor VLSI Circuits," *arXiv preprint arXiv:*1309.7505 (2013).

Kirichenko, Alex F., et al. "Demonstration of an 8×8-bit RSFQ multi-port register file." *Superconductive Electronics Conference (ISEC), 2013 IEEE 14th International*. IEEE, 2013.

Berggren, Karl K., et al. "Low $T_c$ superconductive circuits fabricated on 150-mm-diameter wafers using a doubly planarized Nb/AlO$_x$/Nb process." *Applied Superconductivity, IEEE Transactions on* 9.2 (1999): 3271-3274.

Satoh, Tetsuro, et al. "Fabrication process of planarized multi-layer Nb integrated circuits." *Applied Superconductivity, IEEE Transactions on* 15.2 (2005): 78-81.

Ketchen, M. B., et al. "Sub-µm, planarized, Nb—AlOx—Nb Josephson process for 125 mm wafers developed in partnership with Si technology." *Applied physics letters* 59.20 (1991): 2609-2611.

Nagasawa, S., et al. "Development of advanced Nb process for SFQ circuits." *Physica C: Superconductivity* 412 (2004): 1429-1436.

Nagasawa, S., et al. "New Nb multi-layer fabrication process for large-scale SFQ circuits." *Physica C: Superconductivity* 469.15 (2009): 1578-1584.

Nagasawa, Shuichi, et al. "Planarized multi-layer fabrication technology for LTS large-scale SFQ circuits." *Superconductor Science and Technology* 16.12 (2003): 1483.

Abelson, Lynn A., and George L. Kerber, "Superconductor integrated circuit fabrication technology." *Proceedings of the IEEE* 92.10 (2004): 1517-1533.

Patel, Vijay, and J. E. Lukens, "Self-shunted Nb/AlO$_x$/Nb Josephson junctions." *Applied Superconductivity, IEEE Transactions on* 9.2 (1999): 3247-3250.

Hidaka, M., et al, "Current status and future prospect of the Nb-based fabrication process for single flux quantum circuits." *Superconductor Science and Technology* 19.3 (2006): S138.

Sauvageau, J. E., et al. "Superconducting integrated circuit fabrication with low temperature ECR-based PECVD SiO$_2$ dielectric films." *Applied Superconductivity, IEEE Transactions on* 5.2 (1995): 2303-2309.

Castellano, Maria Gabriella, et al. "Characterization of a fabrication process for the integration of superconducting qubits and rapid-single-flux-quantum circuits." *Superconductor Science and Technology* 19.8 (2006): 860.

Okanoue, K. U. M. I., and K. Hamasaki. "Temperature dependence of the return current in BiSrCaCuO stacks fabricated by self-planarizing process." *Applied Physics Letters* 87 (2005): 252506.

Ketchen, M., et al. "Octagonal washer DC SQUIDs and integrated susceptometers fabricated in a planarized sub-µm Nb—$AlO_x$—Nb technology." *Applied Superconductivity, IEEE Transactions on* 3.1 (1993): 1795-1799.

Hidaka, Mutsuo, et al, "Improvements in fabrication process for Nb-based single flux quantum circuits in Japan." *IEICE transactions on electronics* 91.3 (2008): 318-324.

Brock, Darren K., et al. "Retargeting RSFQ cells to a submicron fabrication process." *Applied Superconductivity, IEEE Transactions on* 11.1 (2001): 369-372.

Tahara, Shuichi, et al. "Superconducting digital electronics." *Applied Superconductivity, IEEE Transactions on* 11.1 (2001): 463-468.

Tolpygo, Sergey K., et al. "20 $kA/cm^2$ process development for superconducting integrated circuits with 80 GHz clock frequency." *IEEE Trans. Appl. Supercond* 17.2 (2007): 946-951.

Bao, Z., et al. "Fabrication of high quality, deep-submicron $Nb/AlO_x/Nb$ Josephson junctions using chemical mechanical polishing." Applied Superconductivity, *IEEE Transactions on* 5.2 (1995): 2731-2734.

Bhushan, M., R. Rouse, and J. E. Lukens. "Chemical-Mechanical Polishing in Semidirect Contact Mode." *Journal of the Electrochemical Society* 142.11 (1995): 3845-3851.

Lichtenberger, A. W., et al. "Fabrication of micron size $Nb/Al$—$Al_2O_3/Nb$ junctions with a trilevel resist liftoff process." *Magnetics, IEEE Transactions on* 27.2 (1991): 3168-3171.

LeDuc, H. G., et al. "Submicron area NbN/MgO/NbN tunnel junctions for SIS mixer applications." *Magnetics, IEEE Transactions on* 27.2 (1991): 3192-3195.

Satoh, Tetsuro, et al. "Improvement of Fabrication Process for 10-$kA/cm^2$ Multi-Layer Nb Integrated Circuits" *Applied Superconductivity, IEEE Transactions on* 17.2 (2007): 169-172.

Bhushan, M., and E. M. Macedo. "Nb/AlOx/Nb trilayer process for the fabrication of submicron Josephson junctions and low-noise dc SQUIDs." *Applied physics letters* 58.12 (1991): 1323-1325.

Silver, A., et al. "Development of superconductor electronics technology for high-end computing," *Superconductor Science and Technology* 16.12 (2003): 1368.

Akaike, H., et al. "Demonstration of a 120 GHz single-flux-quantum shift register circuit based on a 10 $kA\,cm^{-2}$ Nb process." *Superconductor Science and Technology* 19.5 (2006): S320.

Akaike, H., et al. "Design of single flux quantum cells for a 10-Nb-layer process." *Physica C: Superconductivity* 469.15 (2009): 1670-1673.

Numata, Hideaki, and Shuichi Tahara. "Fabrication technology for Nb integrated circuits." *IEICE transactions on electronics* 84.1 (2001): 2-8.

Dmitriev, Pavel N., et al. "High quality Nb-based tunnel junctions for high frequency and digital applications." *Applied Superconductivity, IEEE Transactions on* 13.2 (2003): 107-110.

Chen, W., et al. "Rapid single flux quantum T-flip flop operating up to 770 GHz." *Applied Superconductivity, IEEE Transactions on* 9.2 (1999): 3212-3215.

Numata, Hideaki, et al. "Fabrication technology for high-density Josephson integrated circuits using mechanical polishing planarization." *Applied Superconductivity, IEEE Transactions on* 9.2 (1999): 3198-3201.

Bunyk, P. I., et al. "High-speed single-flux-quantum circuit using planarized niobium-trilayer Josephson junction technology." *Applied physics letters* 66.5 (1995): 646-648.

Gallagher, William J., et al. "Planarization of Josephson integrated circuit." U.S. Pat. No. 5,055,158. 8 Oct. 1991.

Dolata, R., et al. "Single-charge devices with ultrasmall Nb/AlO/Nb trilayer Josephson junctions." *Journal of applied physics* 97 (2005): 054501.

Abelson, Lynn A., et al. "Superconductive multi-chip module process for high speed digital applications." *Applied Superconductivity, IEEE Transactions on* 7.2 (1997): 2627-2630.

Chen, Wei, Vijay Patel, and James E. Lukens. "Fabrication of high-quality Josephson junctions for quantum computation using a self-aligned process." *Microelectronic engineering* 73 (2004): 767-772.

Hidaka, M.; Nagasawa, S.; Hinode, K.; Satoh, T. "Device Yield in Nb-Nine-Layer Circuit Fabrication Process", Applied Superconductivity, IEEE Transactions on, On page (s): 1100906-1100906 Volume: 23, Issue: 3, June 2013.

Satoh, T.; Hinode, K.; Nagasawa, S.; Kitagawa, Y.; Hidaka, M.; Yoshikawa, N.; Akaike, H.; Fujimaki, A.; Takagi, K.; Takagi, N. "Planarization Process for Fabricating Multi-Layer Nb Integrated Circuits Incorporating Top Active Layer", *Applied Superconductivity, IEEE Transactions on*, On page(s): 167-170 Volume: 19, Issue: 3, June 2009

Kunert, J.; Brandel, O.; Linzen, S.; Wetzstein, O.; Toepfer, H.; Ortlepp, T.; Meyer, H. "Recent Developments in Superconductor Digital Electronics Technology at FLUXONICS Foundry", *Applied Superconductivity, IEEE Transactions on*, On page(s): 1101707-1101707 Volume: 23, Issue: 5, October 2013

Satoh, T.; Hinode, K.; Nagasawa, S.; Kitagawa, Y.; Hidaka, M. "Improvement of Fabrication Process for 10-$kA/cm^2$ Multi-Layer Nb Integrated Circuits", *Applied Superconductivity, IEEE Transactions on*, On page(s): 169-172 Volume: 17, Issue: 2, June 2007

Nagasawa, S.; Satoh, T.; Hinode, K.; Kitagawa, Y.; Hidaka, M. "Yield Evaluation of 10-$kA/cm^2$ Nb Multi-Layer Fabrication Process Using Conventional Superconducting RAMs", *Applied Superconductivity, IEEE Transactions on*, On page(s): 177-180 Volume: 17, Issue: 2, June 2007

Tanabe, K.; Hidaka, M. "Recent Progress in SFQ Device Technologies in Japan", *Applied Superconductivity, IEEE Transactions on*, On page(s): 494-499 Volume: 17, Issue: 2, June 2007

Maezawa, M.; Ochiai, M.; Kimura, H.; Hirayama, Fuminori; Suzuki, M. "Design and Operation of RSFQ Cell Library Fabricated by Using a 10-$kA/cm^2$ Nb Technology", *Applied Superconductivity, IEEE Transactions on*, On page (s): 500-504 Volume: 17, Issue: 2, June 2007

Hidaka, M; Nagasawa, S; Satoh, T; Hinode, K; Kitagawa, Y "Current status and future prospect of the Nb-based fabrication process for single flux quantum circuits", *Superconductor Science and Technology*, Volume. 19, Issue. 3, pp. S138, 2006, ISSN: 09532048.

Akaike, H; Yamada, T; Fujimaki, A; Nagasawa, S; Hinode, K; Satoh, T; Kitagawa, Y; Hidaka, M "Demonstration of a 120 GHz single-flux-quantum shift register circuit based on a 10 $kA\,cm^2$ Nb process", *Superconductor Science and Technology*, Volume. 19, Issue. 5, pp. S320, 2006, ISSN: 09532048.

Strauch, Frederick; Williams, Carl "Theoretical analysis of perfect quantum state transfer with superconducting qubits", *Physical Review B*, Volume. 78, Issue. 9, pp. 094516, 2008, ISSN: 10980121.

Mitamura, Naoki; Naito, Naoto; Akaike, Hiroyuki; Fujimaki, Akira "Suppression of Magnetic Flux Trapping by Moats formed in NbN Ground Planes", *Applied Physics Express*, Volume. 4, pp. 013102, 2010, ISSN: 18820778.

Bunyk, Paul I.; Johnson, Mark W.; Hilton, Jeremy P., "SUPERCONDUCTING SHIELDING FOR USE WITH AN INTEGRATED CIRCUIT FOR QUANTUM COMPUTING", U.S. Pat. No. 8,247,799.

Bunyk, Paul I.; Johnson, Mark W.; Hilton, Jeremy P., "SUPERCONDUCTING SHIELDING FOR USE WITH AN INTEGRATED CIRCUIT FOR QUANTUM COMPUTING", U.S. Pat. No. 7,687,938.

U.S. Pat. Nos. 4,075,756; 4,418,095; 4,437,227; 4,448,800; 4,456,506; 4,904,619; 5,055,158; 5,059,448; 5,063,267; 5,091,162; 5,118,530; 5,173,620; 5,229,360; 5,246,782; 5,246,885; 5,256,636; 5,262,201; 5,291,035; 5,298,875; 5,322,817; 5,326,988; 5,347,086; 5,365,476; 5,388,068; 5,409,777; 5,436,029; 5,476,719; 5,477,061; 5,523,686; 5,529,524; 5,548,181; 5,565,695; 5,587,623; 5,609,925; 5,619,097; 5,625,290; 5,689,087; 5,710,437; 5,730,922; 5,742,459; 5,750,474; 5,753,014; 5,764,567; 5,776,863; 5,786,690; 5,801,393; 5,801,984; 5,818,373; 5,820,923; 5,853,808; 5,912,503; 5,923,970; 6,016,000; 6,023,072; 6,051,440; 6,072,689; 6,110,278; 6,110,392; 6,124,198; 6,157,329; 6,190,998; 6,285,050; 6,306,729; 6,384,423; 6,420,251; 6,429,095; 6,528,814; 6,593,212; 6,600,638; 6,623,355; 6,624,047; 6,642,608; 6,717,845; 6,743,078; 6,777,036; 6,804,146; 6,807,090; 6,807,094; 6,809,959; 6,825,106; 6,849,469; 6,852,167; 6,870,761; 6,911,665; 6,926,921; 6,946,597; 6,967,154; 6,975,533; 6,992,344; 7,042,004; 7,042,035; 7,050,329; 7,064,976; 7,068,535; 7,081,417; 7,106,159; 7,115,218; 7,129,552; 7,142,078; 7,160,577; 7,161,112; 7,166,816; 7,215,570; 7,259,434; 7,269,059; 7,279,732; 7,311,944; 7,319,069; 7,323,348; 7,338,907; 7,339,819; 7,371,698; 7,393,699; 7,396,741; 7,397,060; 7,410,668; 7,456,421; 7,463,512; 7,473,576; 7,476,587; 7,505,310; 7,507,519; 7,510,664; 7,514,367; 7,527,985; 7,534,647; 7,535,035; 7,541,198; 7,541,263; 7,541,558; 7,554,144; 7,554,161; 7,560,337; 7,569,844; 7,595,218; 7,605,079; 7,638,359; 7,642,539; 7,646,570; 7,670,646; 7,682,868; 7,687,938; 7,696,506; 7,697,316; 7,732,003; 7,732,800; 7,741,636; 7,749,854; 7,755,076; 7,759,747; 7,786,461; 7,816,661; 7,820,997; 7,821,747; 7,868,539; 7,870,087; 7,872,291; 7,875,493; 7,879,645; 7,884,342; 7,902,038; 7,932,129; 7,956,344; 7,972,893; 7,984,012; 8,003,410; 8,026,038; 8,032,474; 8,039,392; 8,055,318; 8,062,923; 8,076,242; 8,080,440; 8,106,376; 8,110,456; 8,111,541; 8,114,763; 8,119,020; 8,124,426; 8,124,906; 8,143,150; 8,158,963; 8,168,291; 8,178,388; 8,188,563; 8,189,980; 8,211,833; 8,237,140; 8,237,148; 8,244,662; 8,247,799; 8,253,320; 8,301,214; 8,324,734; 8,330,357; 8,339,030; 8,362,576; 8,383,929; 8,384,060; 8,404,620; 8,437,818; 8,513,637; and 8,536,566.

U.S. Pub. Pat. Appln. Nos. 20020055323; 20020068419; 20020148560; 20020197415; 20030194953; 20040056335; 20040061229; 20040071019; 20040081751; 20040151893; 20040159869; 20040206267; 20040222500; 20040266209; 20050042430; 20050058840; 20050121068; 20050123674; 20050149002; 20050149169; 20050182482; 20050191763; 20050197254; 20050237140; 20050240100; 20050244337; 20050261763; 20050267000; 20050278020; 20060030074; 20060073706; 20060097288; 20060138394; 20060142853; 20060162497; 20060165898; 20060165910; 20060166057; 20060255987; 20060264069; 20060270082; 20060284158; 20060286743; 20070108429; 20070131922; 20070138458; 20070155172; 20070158690; 20070161186; 20070173019; 20070176261; 20070194225; 20070241371; 20070259528; 20070278529; 20070281420; 20070285843; 20070298535; 20080023442; 20080060947; 20080096341; 20080106923; 20080116449; 20080135824; 20080138929; 20080138930; 20080138931; 20080150422; 20080173931; 20080192534; 20080203375; 20080217648; 20080218519; 20080246014; 20080247224; 20080258126; 20080259672; 20080266940; 20080277766; 20090008632; 20090014706; 20090032796; 20090042335; 20090079494; 20090098716; 20090101883; 20090102369; 20090104771; 20090189138; 20090230376; 20090230378; 20090236743; 20090239358; 20090295510; 20100012167; 20100012353; 20100068878; 20100133514; 20100178825; 20100207095; 20100216279; 20100221888; 20100237316; 20100279000; 20100297824; 20110012084; 20110024409; 20110057169; 20110060711; 20110076825; 20110079817; 20110089405; 20110124483; 20110136282; 20110163455; 20110168089; 20110174519; 20110186775; 20110207289; 20110238607; 20120000691; 20120012833; 20120012870; 20120012897; 20120133050; 20120164429; 20120263935; 20130043452; 20130076231; 20130082232; 20130083443; 20130096825; 20130196856; and 20130200429.

Each of the foregoing references and patent documents is expressly incorporated herein by reference in its entirety.

SUMMARY OF THE INVENTION

The planarized fabrication process technique of the present technology features pattern-independent interlayer dielectric planarization. This technique allows faster planarization with integrated stackable via-plugs. Further, it can be combined with legacy non-planarized layers above a planarized base. It is further referred to as Rapid Integrated Planarized Process for Layer Extension (RIPPLE).

FIGS. 14-20 show cross-sections (B) and perspective top views (A) of various stages of the planarized process. For compatibility with the Hypres Inc. legacy (non-planarized) 4-layer process, additional wiring layers are provided underneath the ground plane (layer M0), which was the base layer on the wafer in the legacy process. These "underground" layers (Mn1-Mn8 in FIG. 24, where n stands for "negative") illustrate the extendible nature of RIPPLE.

One embodiment of the process is summarized in FIGS. 14-20, for providing a single extended superconducting layer. This starts with a sputter deposition of a Nb/Al/Nb trilayer (200 nm/10 nm/200 nm film thicknesses), where the top Nb film is used to define via plugs, the bottom for the wiring layer, and Al in between them as an etch stop. Of course, other superconducting materials and etch stop technologies may be employed. The first step is the via (In1) plugs definition done by etching the top niobium layer by using $SF_6$ chemistry with hard etch stop at the Al layer (FIGS. 14A and 14B). Note that this via is in the upper layer, but is patterned before patterning the wiring in the lower layer, opposite to the standard process.

The next step is removing residual aluminum. This can be accomplished by using either wet-etch or dry-etch process. A reliable wet etch process uses ion-free metal developer at an etch rate of 5 nm/min, while a dry etch can be done either by inductively coupled plasma reactive ion etch (RIE) in chlorine chemistry, or by ion beam milling. Note that the 10 nm of Al left between the two Nb layers in the via does not degrade the superconductivity in the via during circuit operation, since the thin Al is induced into the superconducting state by the Nb on both sides.

The next step is patterning the metallic wires in the lower Nb layer, using pattern Mn1, after the top Nb via has already been defined, completing the reversal of the standard process. There is no planarized intermediate step of the type shown in FIG. 25B.

The next step is a deposition of a 200 nm interlayer dielectric ($SiO_2$), done with PECVD (FIGS. 16A and 16B) that conformally covers the entire wafer with a 200 nm thick $SiO_2$. Then, the wafer is patterned with a complementary to the metal pattern (Mn1) mask biased by 0.2-µm for misalignment compensation (Mn1c). The mask has been generated automatically, omitting smaller than 0.6 µm objects. All $SiO_2$ on top of the metal, except for a narrow (~0.2 µm) Caldera edge (similar to that in the Hinode process), is etched away in $CHF_3/O_2$ RIE chemistry. The resulting structure is shown in FIGS. 17A and 17B. Then, the second interlayer dielectric is deposited on the entire wafer (FIGS. 18A and 18B) with its thickness (200 nm) equal to the thickness of the plug layer (top Nb layer of the trilayer deposited during the first step).

In the next step, a mask, In1c, complementary to via mask In1, is used to pattern and remove $SiO_2$ from the top of via plugs (FIGS. 19A and 19B). After this stage, the wafer is populated with 200-nm-thick by ~200-nm-wide uniform structures. These pattern-independent structures can be easily removed from the entire wafer by chemical-mechanical planarization. The polishing rate for these structures is 3 times faster than the rate for a blanket film. The final planarized layer and a plugged via are shown in FIGS. 20A and 20B. Even though the CMP step is the only step that doesn't have a direct method of determining the end-point, it has been made reliable by the pattern-independent nature of the technique. Moreover, only one CMP step is needed for defining a wiring layer and via plugs.

This sequence can be repeated for any given number of wiring layers, thus producing reliable fabrication process extension. A key advantage of this approach is that it is fully compatible with all designs made for the legacy 4-layer non-planarized process.

An alternative embodiment of the new process (FIGS. 26A, 26B and 26C) can be achieved without the need for the Al etch-stop layer (and for the steps corresponding to the removal of residual aluminum). The process starts with the deposition of 200 nm niobium thin film followed by via plugs patterning and definition (FIG. 26A). The next step is to deposit a 200-nm thick niobium film by sputtering (FIG. 26B). During this step, the via-plugs will get coated conformally and grow together with the wiring layer. At this stage, the wiring layer is patterned and defined; the resulting structure is shown in FIG. 26C. Then 200 nm PECVD $SiO_2$ (the same thickness as the wiring layer) is deposited, yielding the same structure as shown in FIGS. 16A and 16B, except for the aluminum. The rest of the process follows the RIPPLE steps described with respect to FIGS. 17-20. The other advantage of this process is the elimination of the additional complementary mask for the via-plugs (In1c). This is possible because the plug area has already been enlarged by the needed misalignment compensation of 200 nm during the deposition of the wiring layer. As a result, the same mask (In1) can be used with a negative resist for etching the interlayer dielectric (ILD) inside the via (as in FIGS. 19A and 19B). In this case also, only a single CMP step is needed for each wiring layer, including the via plug. This alternative embodiment may provide improved reliability and speed by skipping the aluminum etch step.

These are representative examples of the RIPPLE process, and others are also possible. The key is to require only a single CMP step for each wiring bi-layer in a process that can be extended to an arbitrary number of such bi-layers with small stacked vias between them, that can be scaled to arbitrarily small dimensions, while maintaining the possibility of non-planarized layers on top.

It is therefore an object to provide a planarized integrated circuit on a substrate, comprising: at least one planarized layer, and preferably a plurality of planarized layers formed successively on the substrate, each respective layer comprising: an electrically conductive layer; an electrically conductive via layer adjacent to the electrically conductive layer; wherein the electrically conductive via layer adjacent to the electrically conductive layer is patterned into a set of vias which define a set of vertically extending structures which electrically interconnect with conductive structures of an adjacent layer, and the electrically conductive layer is patterned into a set of wires by removal of the surrounding portions of the electrically conductive layer, with the set of vertically extending structures extending above the set of wires; and a planarized insulating layer formed over the set of wires and the set of vias, such that upper portions of the set of vertically extending structures are exposed through the planarized insulating layer.

It is also an object to provide a method of forming a planarized integrated circuit on a substrate, comprising a planarized layer, and preferably a series of successive planarized layers, comprising: forming an electrically conductive layer; forming an electrically conductive via layer; patterning the via layer into a set of vias; after patterning the electrically conductive via layer, patterning the electrically conductive layer into a set of wires, wherein portions where the set of vias coincide in a plane of the planarized layer with the set of wires define vertically extending conductive structures configured to provide a conductive path between the set of wires of the respective layer and a set of wires of an adjacent layer; forming an insulating layer surrounding the set of wires and the set of vias; and planarizing the insulating layer such that portions of the vertically extending structures are exposed and the set of wires is covered.

The electrically conductive layer may be covered with an etch stop layer, and the electrically conductive via layer formed over the etch stop layer, the electrically conductive via layer formed over the etch stop layer being patterned into the set of vias exposing the etch stop layer surrounding the set of vias, and the electrically conductive layer is subsequently patterned into a set of wires by removal of the surrounding portions of the etch stop layer and electrically conductive layer, such that portions of the electrically conductive via layer are exposed through the planarized insulating layer.

The electrically conductive layer and the electrically conductive via layer may each be formed of a cryogenically superconductive material, and the etch stop layer formed of a material susceptible to induced superconductivity by proximity to the cryogenically superconductive material at cryogenic temperatures. The etch stop layer may comprise aluminum.

The electrically conductive layer may alternately be formed over the set of vias formed by patterning the electrically conductive via layer, the electrically conductive layer being patterned into the set of wires superposed on the set of vias, such that portions of the set of wires which overlie the set of vias form tops of the vertically extending structures which are exposed through the planarized insulating layer.

At least one of the electrically conductive layer and the electrically conductive via layer may comprise a niobium-based superconductive material.

The insulating layer may comprise silicon dioxide.

The integrated circuit may further comprise at least one non-planarized circuit layer lying above at least one planarized layer.

The integrated circuit may further comprise at least one Josephson junction formed within a planarized layer or a non-planarized layer formed on top of the planarized layers, electrically connected to the set of wires.

The integrated circuit may further comprise a single-flux-quantum circuit formed within a planarized layer or a non-planarized layer, electrically connected to the set of wires.

A minimum transverse dimension of a conductive wire may be less than 1 micron.

At least one conductive layer may comprise a ground plane.

At least 10 planarized layers may be present.

The method may further comprise depositing the electrically conductive layer on a planarized surface of a preceding layer, forming an etch stop layer on the electrically conductive layer, and forming the electrically conductive via layer over the etch stop layer, wherein the electrically conductive via layer is initially patterned to expose the etch stop layer surrounding the set of vias, and the portions of the etch stop layer and electrically conductive layer surrounding the set of wires are subsequently removed, such that the set of vias comprise the vertically extending structures.

The electrically conductive layer and the electrically conductive via layer may each be independently formed of a cryogenically superconductive material, and the etch stop layer may be formed of a material susceptible to induced superconductivity by proximity to the cryogenically superconductive material at cryogenic temperatures.

The method may further comprise depositing the electrically conductive via layer on a planarized surface of a preceding layer, patterning the electrically conductive via layer to form the set of vias, forming the electrically conductive layer over the formed set of vias, and patterning the electrically conductive layer formed over the set of vias, wherein portions of the electrically conductive layer which are superposed on the set of vias comprise the vertically extending structures.

The planarizing may comprise chemical-mechanical polishing.

The integrated circuit may be formed with a various number of successive planarized layers, e.g., 1, or 2, or 3, or 4, or 5, or 6, or 7, or 8, or 9, or 10, or 11, or 12, or 13, or 14, or 15, or 16, or more successive planarized layers.

At least one of the electrically conductive layer, the electrically conductive via layer, and an optional etch stop layer formed on the electrically conductive layer may be deposited using sputtering. The insulating layer may be deposited by plasma enhanced chemical vapor deposition. At least one of the electrically conductive layer and the electrically conductive via layer may be patterned by reactive ion etching.

The method may further comprise creating narrow peaks around edges of the insulating layer, to provide a pattern-independent planarization of the insulating layer.

The electrically conductive layer and the electrically conductive via layer may each be formed of a cryogenically superconductive material, optionally separated by a layer which is inducible to superconductivity by proximity to cryogenically superconductive material under cryogenic conditions.

A further object provides a planarized integrated circuit having a substrate, comprising at least one planarized layer formed on the substrate, a respective planarized layer comprising:

at least two layers of cryogenically superconductive material, a wiring layer patterned to provide lateral conductive pathways in a plane of a respective layer, and a via layer patterned to provide vertically conductive pathways between adjacent layers, wherein the via layer is patterned prior to the wiring layer such that a respective via comprises a stack of the electrically conductive via layer and the electrically conductive layer to having a height above a surrounding portion of the wiring layer; and an insulating layer formed over the at least two layers, covering the wiring layer, wherein the insulating layer is planarized to expose an upper portion of the stacks of electrically conductive via layer and the electrically conductive layer.

The electrically conductive via layer and the electrically conductive layer may each be formed of a cryogenically superconducting material, having an optional induced superconductivity layer therebetween, the integrated circuit further comprising a least two Josephson junctions electrically communicating through at least one wiring layer. The Josephson junctions may be formed in different layers, or the same layer, and the layer(s) in which they are formed may be planarized or non-planarized. For example, the Josephson junctions may be formed on an upper set of layers which are non-planarized, formed over a stable of planarized wiring layers, which may include various passive components, such as resistors and inductors, in addition to the set of wires.

BRIEF DESCRIPTION OF THE DRAWINGS

FIGS. 21A and 21B show an alternative method (using Anodization);

Figure 12:
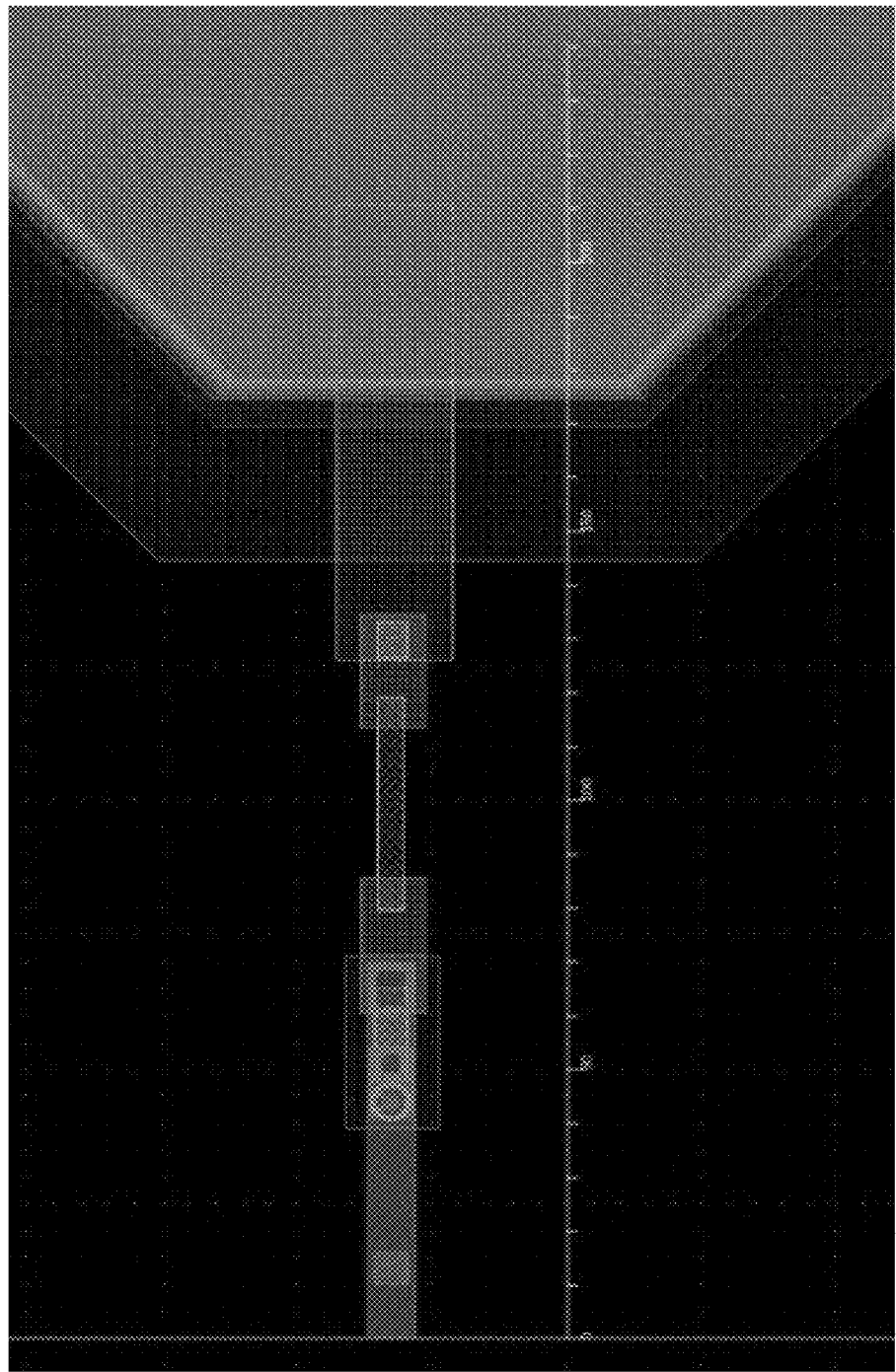
FIG. 12 show a layout of a shunted Junction of the Prior Art Hypres Inc. process, connected to bias pad with a bias resistor and grounded through the base electrode of the junction.

DETAILED DESCRIPTION OF THE PREFERRED EMBODIMENTS 1.0 Prior Art Fabrication Process The details of a known Hypres Inc. (Elmsford N.Y.) the process flow will be described by following the cross-section of a biased, shunted Josephson junction as it made layer-by-layer. The layout of this is given in FIG. 12, which shows a layout of a shunted Junction connected to a bias pad with a bias resistor and grounded through the base electrode of the junction.

The process starts with a bare 150 mm diameter oxidized silicon wafer by deposition the first Nb metal layer (M0). Of course, other substrates may be used. Typically, the substrate is planarized before the first step, and indeed, may be a planarized circuit formed from preceding manufacturing steps.

Figure 1:
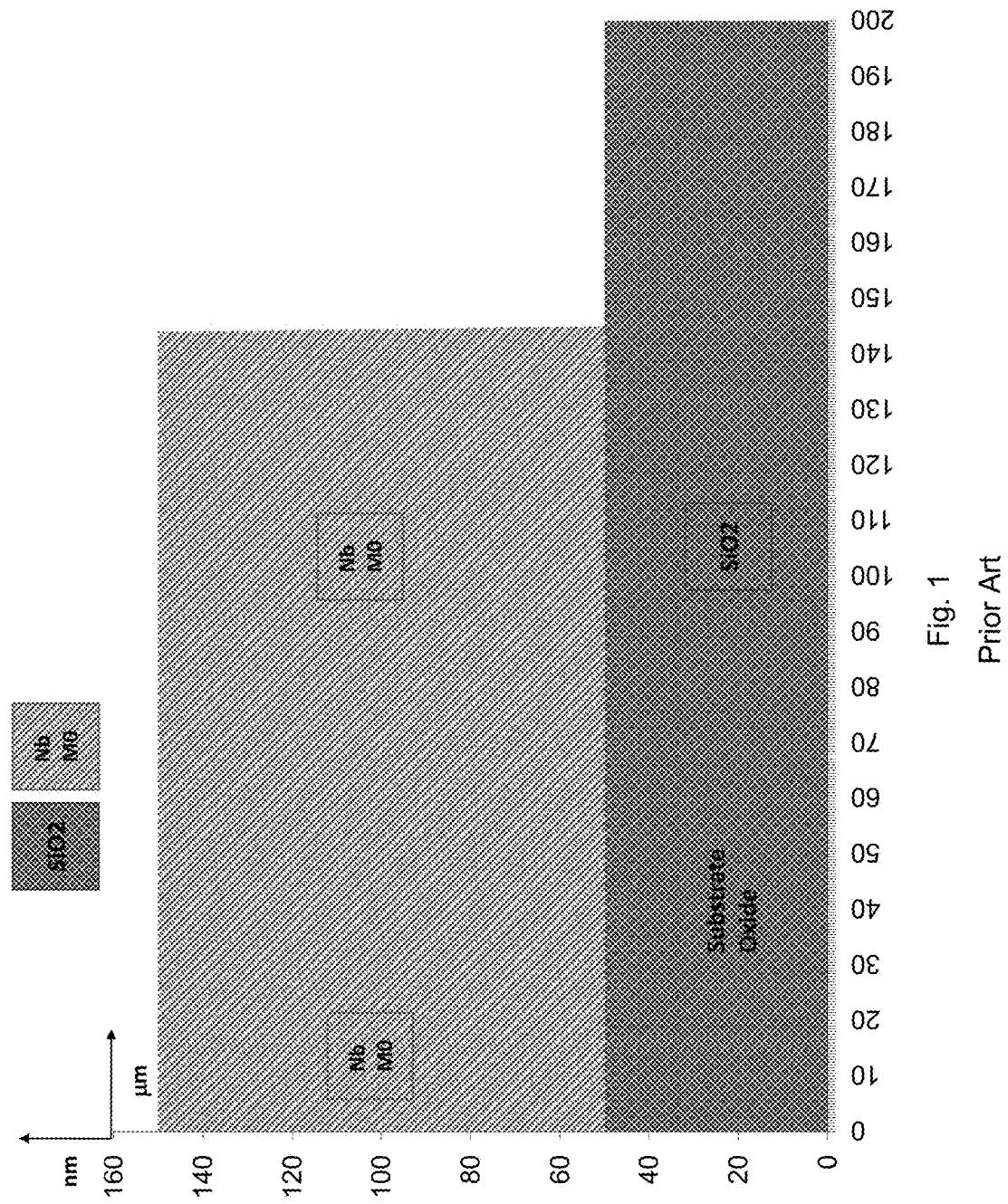
FIG. 1 shows a First layer of the Prior Art Hypres Inc. process M0, sputter deposited, dark field mask lithography, $SF_6$ RIE etched, chemically stripped. Moats and ground pad holes defined.

The deposition is done in a cryo-pumped chamber to a pressure of about $10^{-7}$ Torr. Magnetron sputtering is used for deposition, where the wafer is scanned under the target at constant speed. Both the scan speed and the chamber pressure are adjusted to get the required film thickness growing without stress. At 3 kW power the wafer is scanned at 20 cm/sec to make a film of thickness 1000 Å for M0 at a stress-free chamber pressure of 17 mTorr. After deposition the Nb thin film is patterned using the M0-mask, a dark field mask and a positive photoresist AZ5214-E IR. The pattern is transferred to the thin film after etching it in end-point-detected $SF_6$ plasma RIE. Following etching, the resist and etch by-products are stripped and cleared by wet processing. The final cross section after the completion of the first layer is given in FIG. 1 (The figure is to scale with nano-meter scale on the Y-axis and micro-meter scale on the X-axis), shows a First layer—M0, sputter deposited, dark field mask lithography, $SF_6$ RIE etched, chemically stripped. Moats and ground pad holes are defined.

The following describes the 11 layers of the standard Hypres Inc. (Elmsford N.Y.) legacy (non-planarized) fabrication process, according to a preferred embodiment:

1.1 M0—the First Niobium Superconductor Layer

The first Niobium superconductor layer is grown to a thickness of 1000 Å±10% and the film's sheet resistance at room temperature is 1.90±0.2Ω/□. In a circuit this layer is used as grounding and most of the return current flows through it. To reduce the effect of ground current induced magnetic field interference to the operation of the circuit, a number of holes and moats are included in this layer. Holes and moats can have a minimum size of 2×2 µm and a bias (0.25±0.25) µm and a minimum spacing of 3 µm between them.

1.2 I0—Interlayer Dielectric Between M0 and M1

Figure 2:
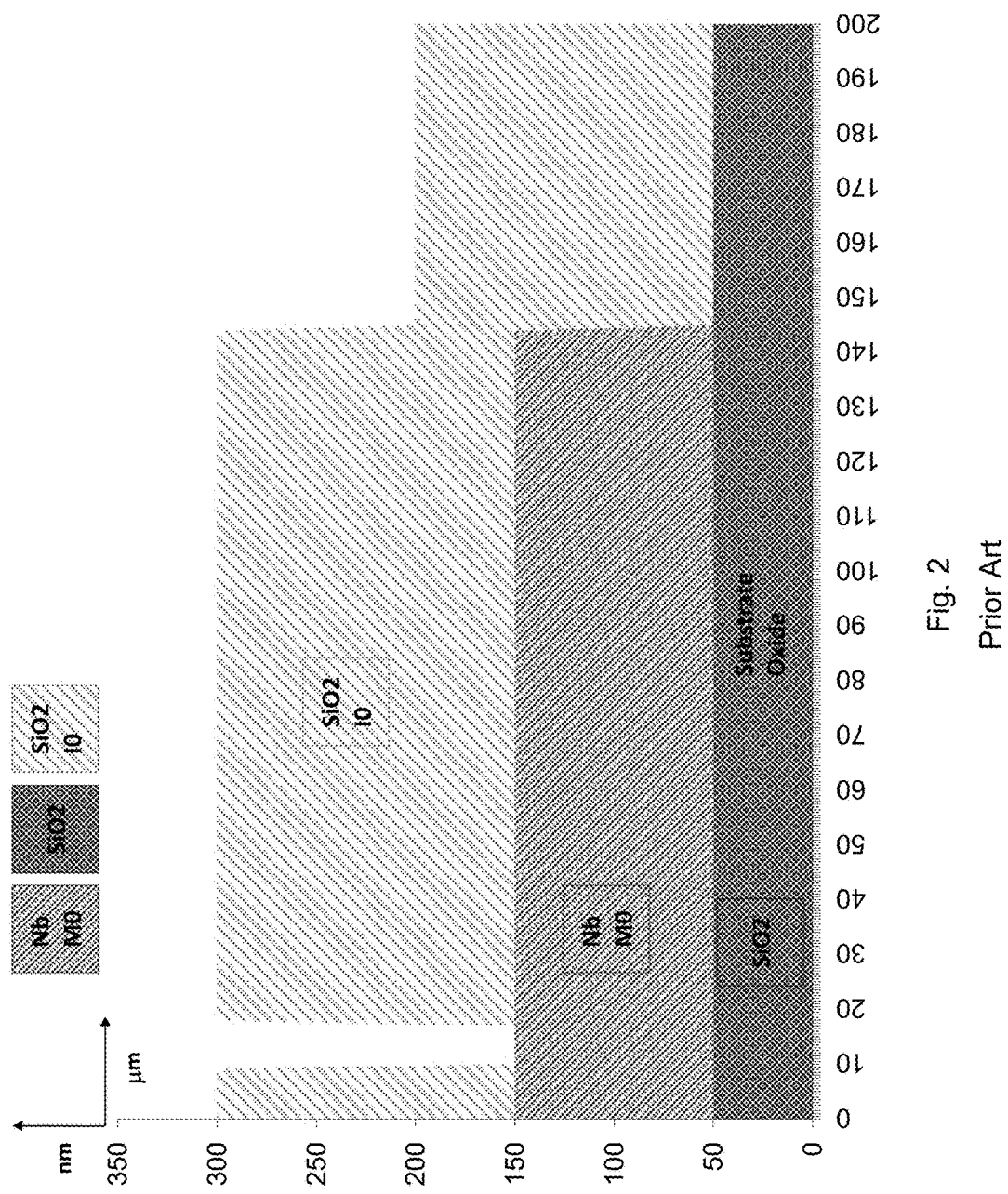
FIG. 2 shows the Second layer of the Prior Art Hypres Inc. process I0, Ion Beam deposited, dark field mask lithography defining Vias between M1 and M0, etched in $CH_4+O_2$ mixture, chemically stripped.

FIG. 2 shows the Second layer I0—Ion Beam deposited, dark field mask lithography defining Vias between M1 and M0, etched in $CH_4+O_2$ mixture, chemically stripped.

The interlayer dielectric between M0 and M1 is PECVD deposited $SiO_2$ insulator of thickness 1500 Å±10% with a specific capacitance of 0.277 $fF/µm^2$±20%. Contact to M0 is through I0 vias with a minimum size of 2×2 µm and a bias (0.30±0.25) µm. The alignment tolerance of I0 to M0 is ±0.25 µm.

1.3 I1C—Niobium Superconductor Counter Electrode of the Tri-Layer

Figure 3:
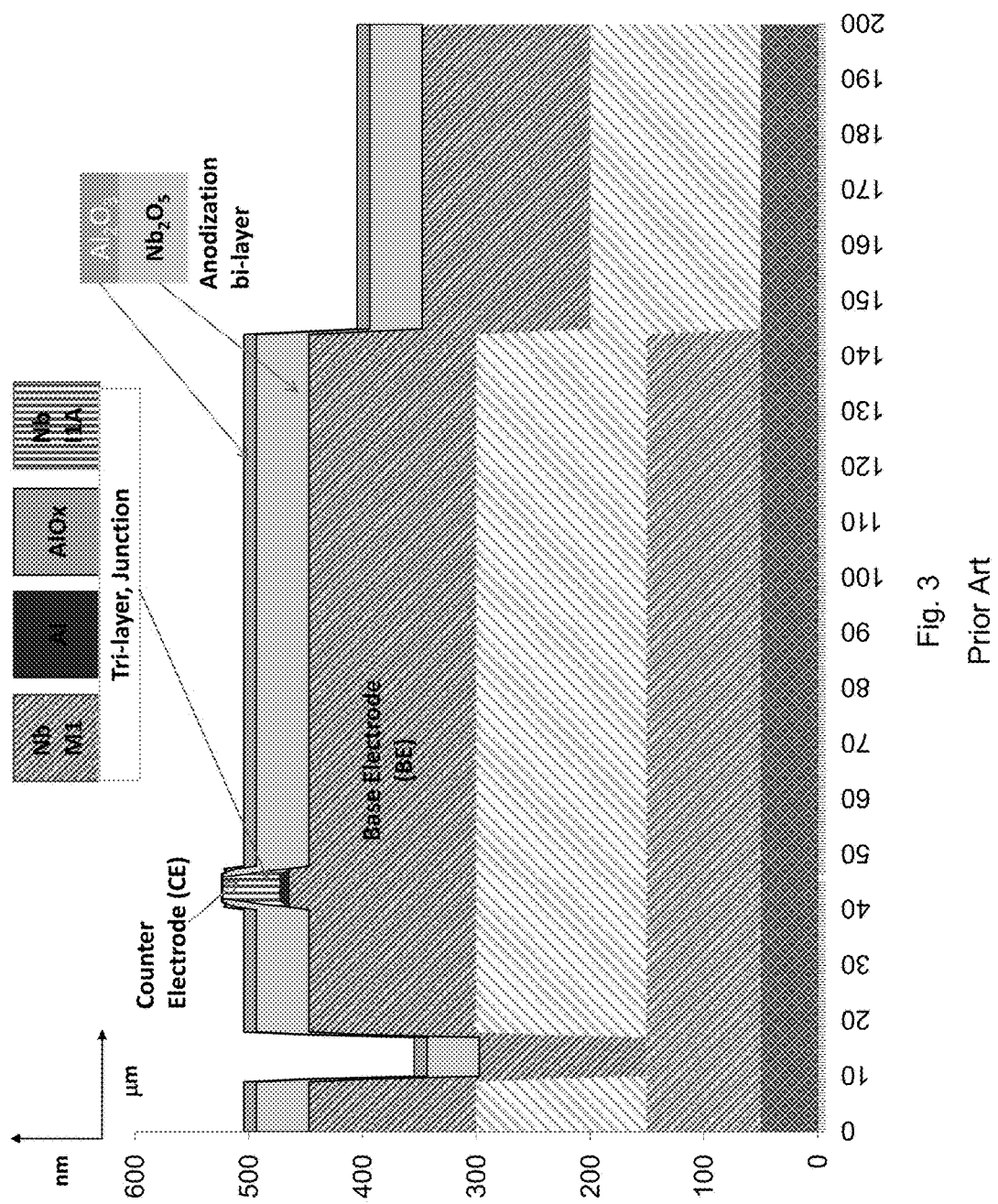
FIG. 3 shows the Third layer of the Prior Art Hypres Inc. process Tri-layer in situ sputter deposited Nb/Al/AlOx/Nb, I1C clear field mask lithography defining junctions hard baked photoresist, Anodization, chemically stripped.

FIG. 3 shows the Third layer—Tri-layer in situ sputter deposited Nb/Al/AlO$_x$/Nb, I1C clear field mask lithography defining junctions hard baked photoresist, Anodization, chemically stripped.

The Niobium superconductor counter electrode of the tri-layer is deposited by magnetron sputtering in a load locked, cryo-pumped chamber with a base pressure of 1×10$^{-9}$ T. It is grown to a thickness of 500 Å±10%. Junctions are defined in this layer by using a Clearfield mask I1C. The alignment tolerance of I1C to M0 and/or I0 is ±0.25 µm. After the counter electrode is etched in $SF_6$ plasma, the wafer is anodized.

1.4 A1—$Al_2O_3$/$Nb_2O_5$ Double Layer

Figure 4:
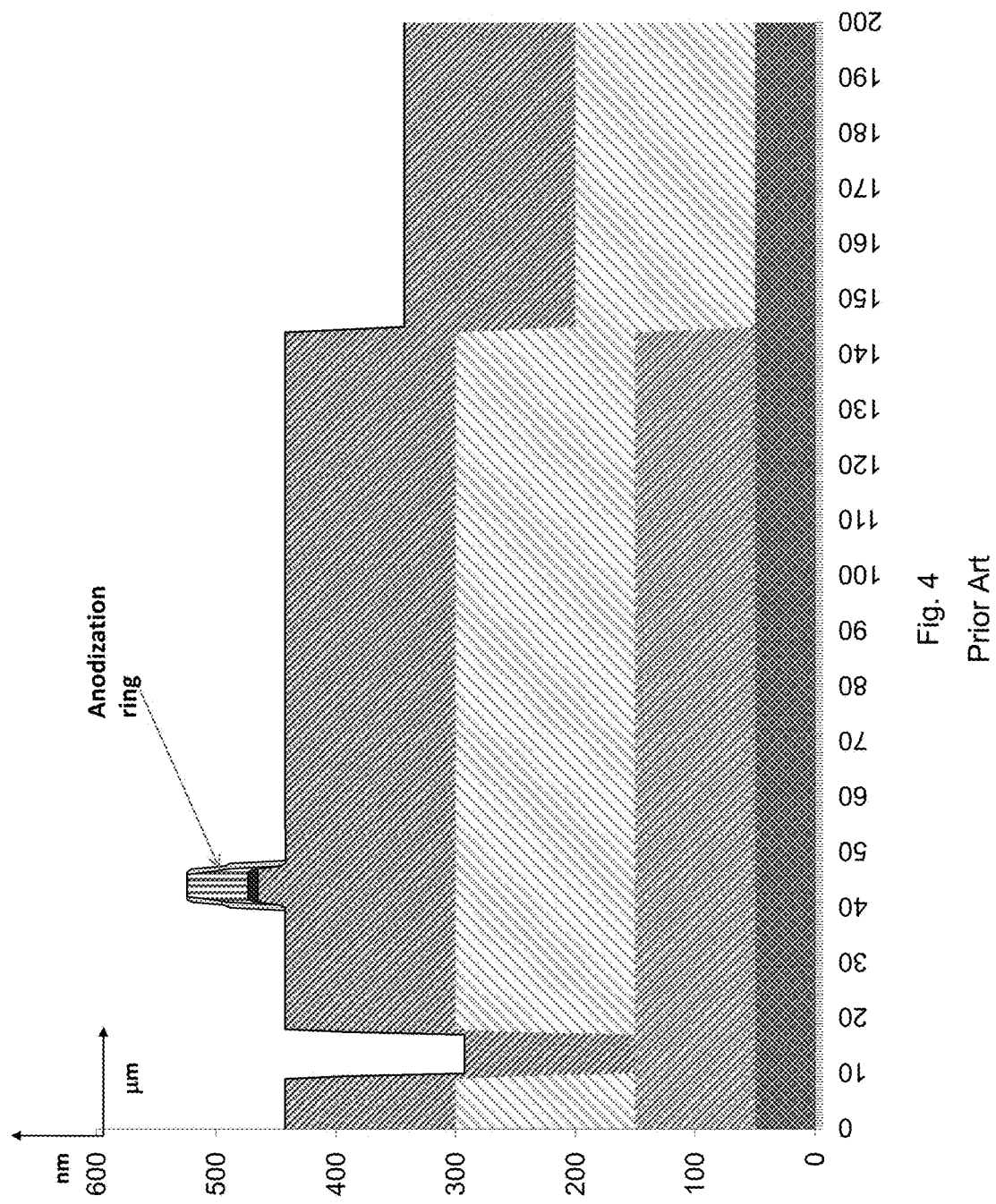
FIG. 4 shows the Fourth layer of the Prior Art Hypres Inc. process A1, Anodization ring definition, A1 clear field mask lithography defining Josephson Junctions, Ion Beam milled, chemically stripped.

FIG. 4 shows the Fourth layer—A1, Anodization ring definition, A1 clear field mask lithography defining Josephson Junctions, Ion Beam milled, chemically stripped.

The A1—$Al_2O_3$/$Nb_2O_5$ double layer is grown by anodization after RIE of the base electrode by applying a constant voltage of about 28 mV and 700 mA initial current forming a double protecting layer of $Al_2O_3$ and $Nb_2O_5$. The thickness of the bi-layer is about 560 Å±10%. After A1 definition the remaining bi-layer surrounds the Josephson junctions by about 0.5 µm. A1 is aligned to I1C with an alignment tolerance of ±0.25 µm.

1.5 M1—Niobium Superconductor Counter Electrode of the Tri-Layer

Figure 5:
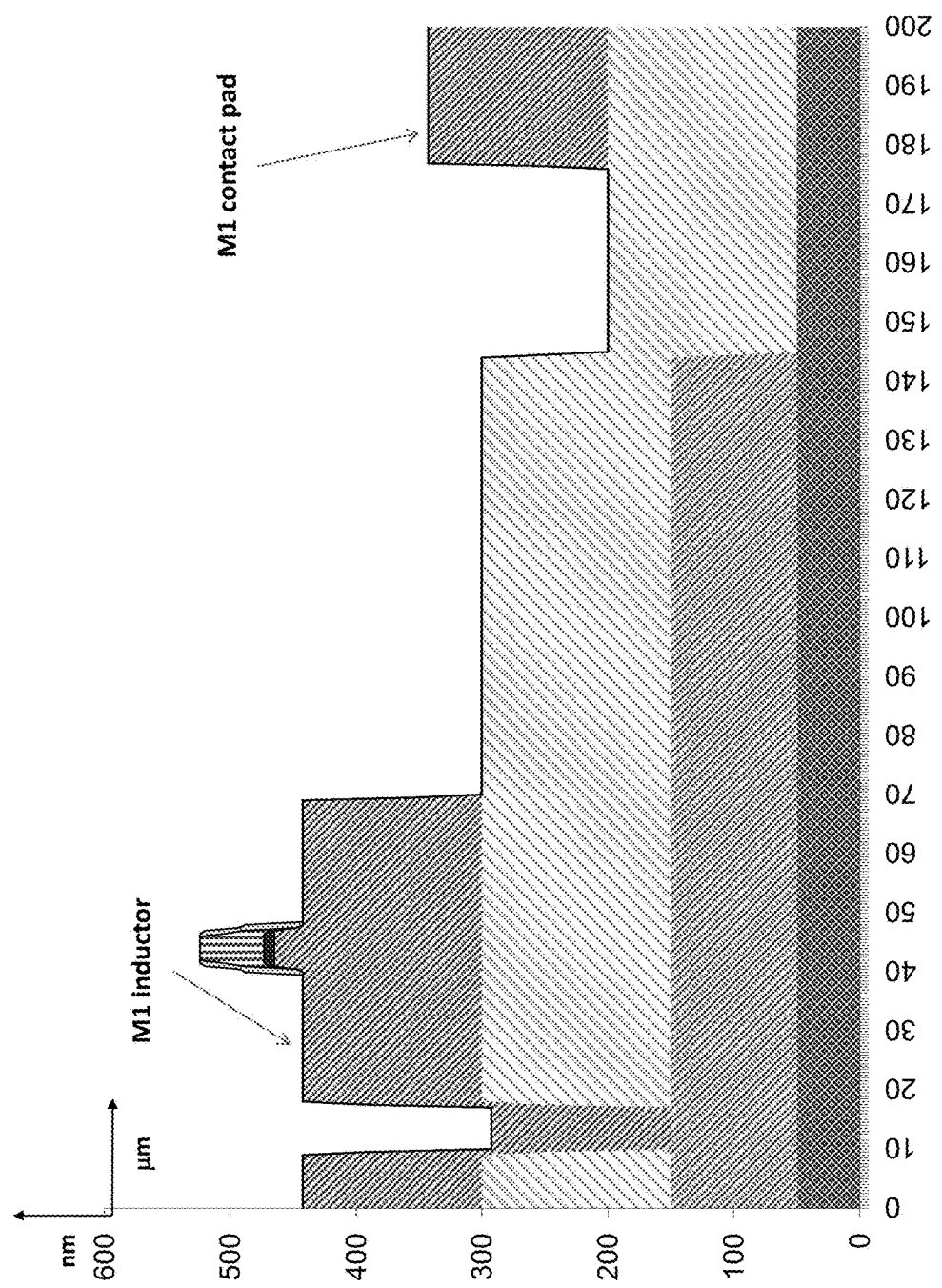
FIG. 5 shows the fifth layer of the Prior Art Hypres Inc. process M1, base electrode of the tri-layer. M1 clear field mask lithography defining inductances and interconnects by RIE, chemically stripped.

FIG. 5 shows the fifth layer—M1, base electrode of the tri-layer. M1 clear field mask lithography defining inductances and interconnects by RIE, chemically stripped.

The Niobium superconductor counter electrode of the tri-layer is deposited by magnetron sputtering in a load locked, cryo-pumped chamber with a base pressure of $1\times10^{-9}$ T. It is grown to a thickness of 1500 Å±10% and the film's sheet resistance at room temperature is $1.70\pm0.2\Omega/\square$. Most circuit inductances are defined in this layer by microstrip lines with M0 as ground plane and M2 for double ground plane. A specific inductance of 0.487±0.007 pH with a fringing factor of 0.54±0.13 µm. Minimum line width 2 µm and a bias (−0.30±0.25) µm. The alignment tolerance of M1 to M0 and/or I0 is ±0.25 µm.

1.6 R2—Molybdenum Resistor Material

Figure 6:
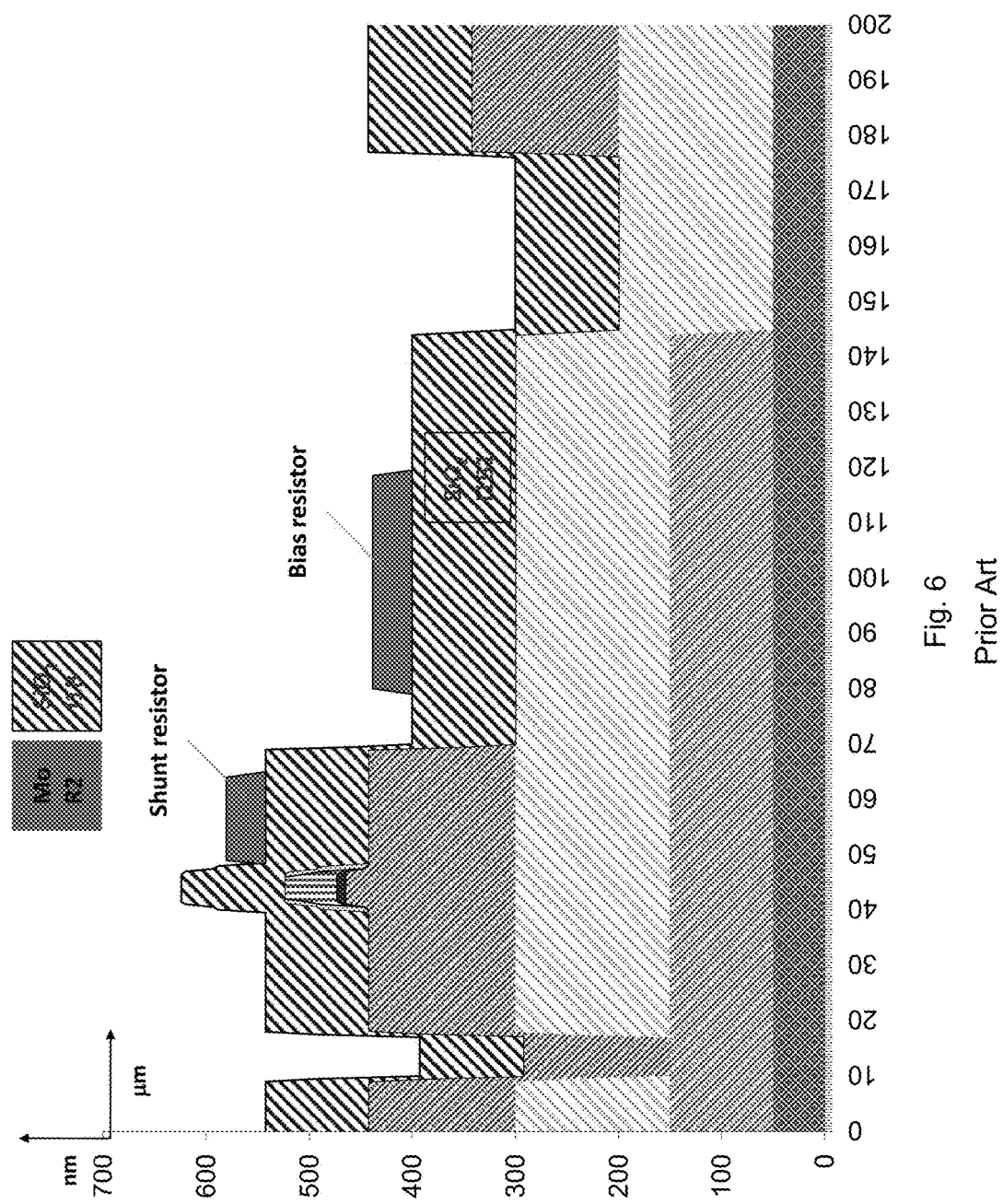
FIG. 6 shows the sixth layer of the Prior Art Hypres Inc. process R2, Sputter deposited molybdenum, clear field mask lithography defining the shunt and bias resistors of the circuit, $SF_6$ plasma etched, chemically stripped.

FIG. 6 shows the sixth layer R2, Sputter deposited molybdenum, clear field mask lithography defining the shunt and bias resistors of the circuit, $SF_6$ plasma etched, chemically stripped.

The Molybdenum resistor material is deposited by magnetron sputtering in a load locked; cryo-pumped chamber with a base pressure of $1\times10^{-7}$ T right after the first part of the I1B1 dielectric is deposited. It is grown to a thickness of 750 Å±10% and the film's sheet resistance at room temperature is $1.95\pm0.1\Omega/\square$ and is reduced to $1.0\pm0.1\Omega/\square$ at 4.2 K. Minimum line width allowed is 2 µm and a bias (−0.2±0.25) µm. This bias is corrected on the mask. Shunt and bias resistors are defined in this layer. The alignment tolerance of R2 to I1A is ±0.25 µm.

1.7 I1B—Interlayer Dielectric Between Tri-Layer and R2-I1B1; Tri-Layer and M2-I1B2

Figure 7:
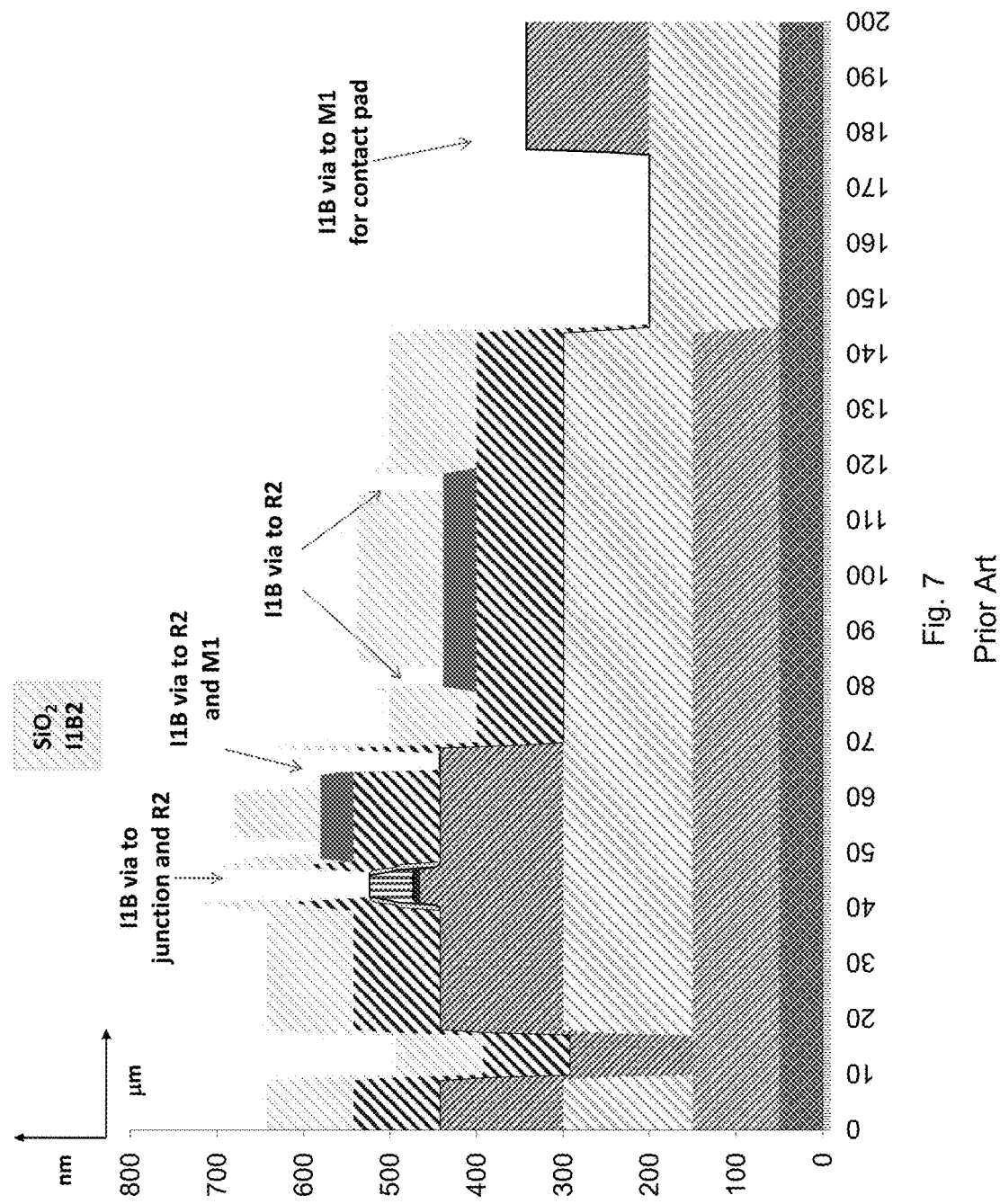
FIG. 7 shows the seventh layer of the Prior Art Hypres Inc. process I1B-1 and I1B-2, PECVD deposited, I1B lithography dark field mask defining vias to Junction, resistors and contact pads, etched in CH4+O2 mixture, chemically stripped.

FIG. 7 shows the seventh layer I1B-1 and I1B-2—PECVD deposited, I1B lithography dark field mask defining vias to Junction, resistors and contact pads, etched in $CH_4+O_2$ mixture, chemically stripped.

I1B1 and I1B2 are PECVD deposited $SiO_2$ insulator of thickness 2000 Å±20% with a specific capacitance of 0.416 $fF/\mu m^2\pm20\%$. Contact to M1 and I1A is through I1B vias with a minimum size of 2 µm and a bias (0.20±0.25) µm. The alignment tolerance of I1B to I1A is ±0.1 µm.

1.8 M2—Niobium Superconductor Material

Figure 8:
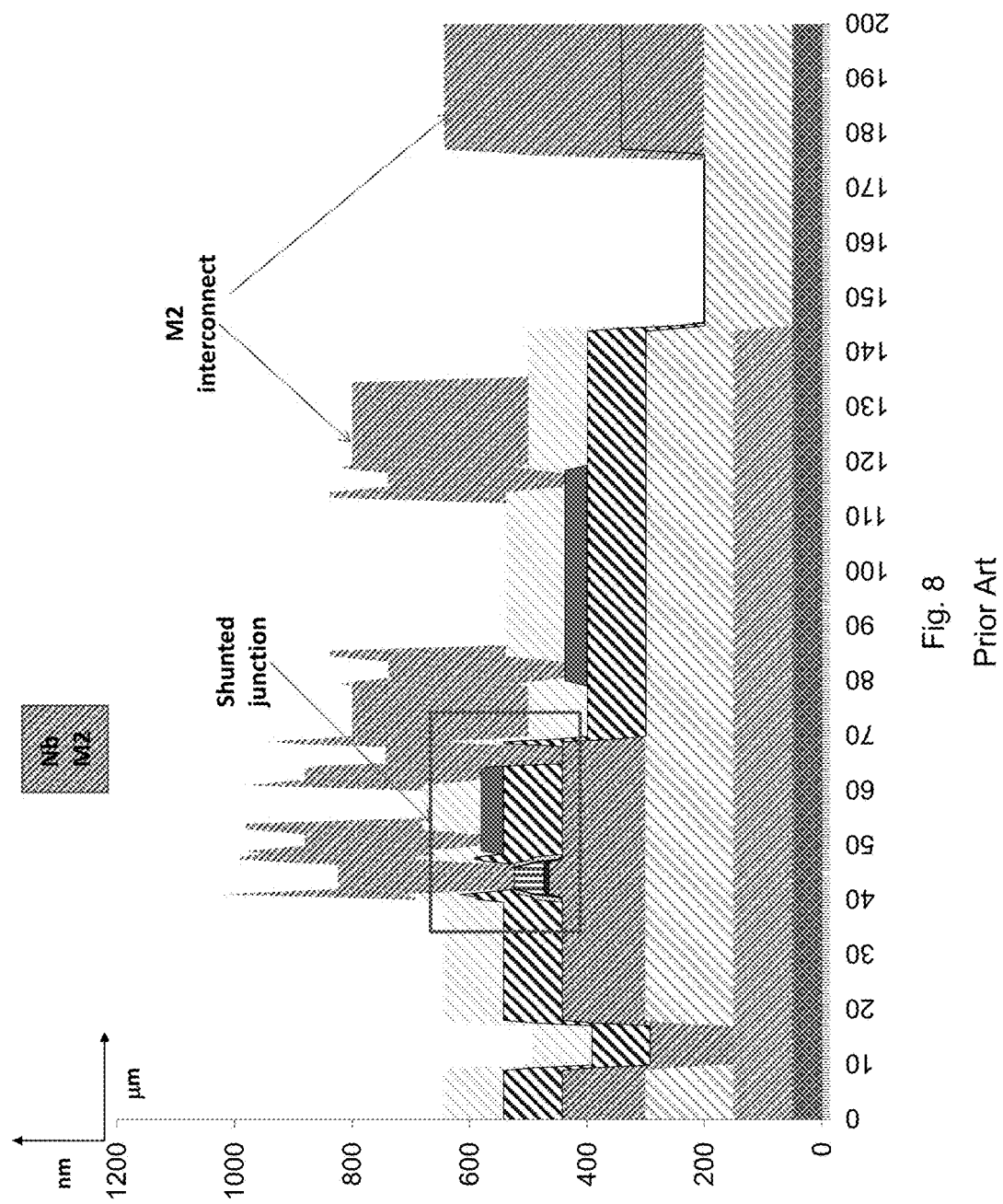
FIG. 8 shows the Eighth layer of the Prior Art Hypres Inc. process M2, sputter deposited niobium, clear field mask lithography defining M2 inductors and interconnects, $SF_6$ RIE etched, chemically stripped.

FIG. 8 shows the Eighth layer—M2, sputter deposited niobium, clear field mask lithography defining M2 inductors and interconnects, $SF_6$ RIE etched, chemically stripped.

The Niobium superconductor material is deposited by magnetron sputtering in a load locked, cryo-pumped chamber with a base pressure of $1\times10^{-7}$ T. It is grown to a thickness of 3000 Å±10% and the film's sheet resistance at room temperature is $1.60\Omega/\square\pm10\%$. Minimum line width 2 µm and a minimum gap between lines of 2.5 µm and a bias of (−0.5±0.25) µm. The alignment tolerance of M2 to I1B is ±0.25 µm. This layer is mainly used for wiring, as an inductor with M0 as a ground plane and M3 for double ground plane. A specific inductance of 0.67±0.01 pH/$\square$ and Josephson penetration and a fringing factor of 0.98±0.19 µm.

1.9 I2—Interlayer Dielectric Between M2 and M3

Figure 9:
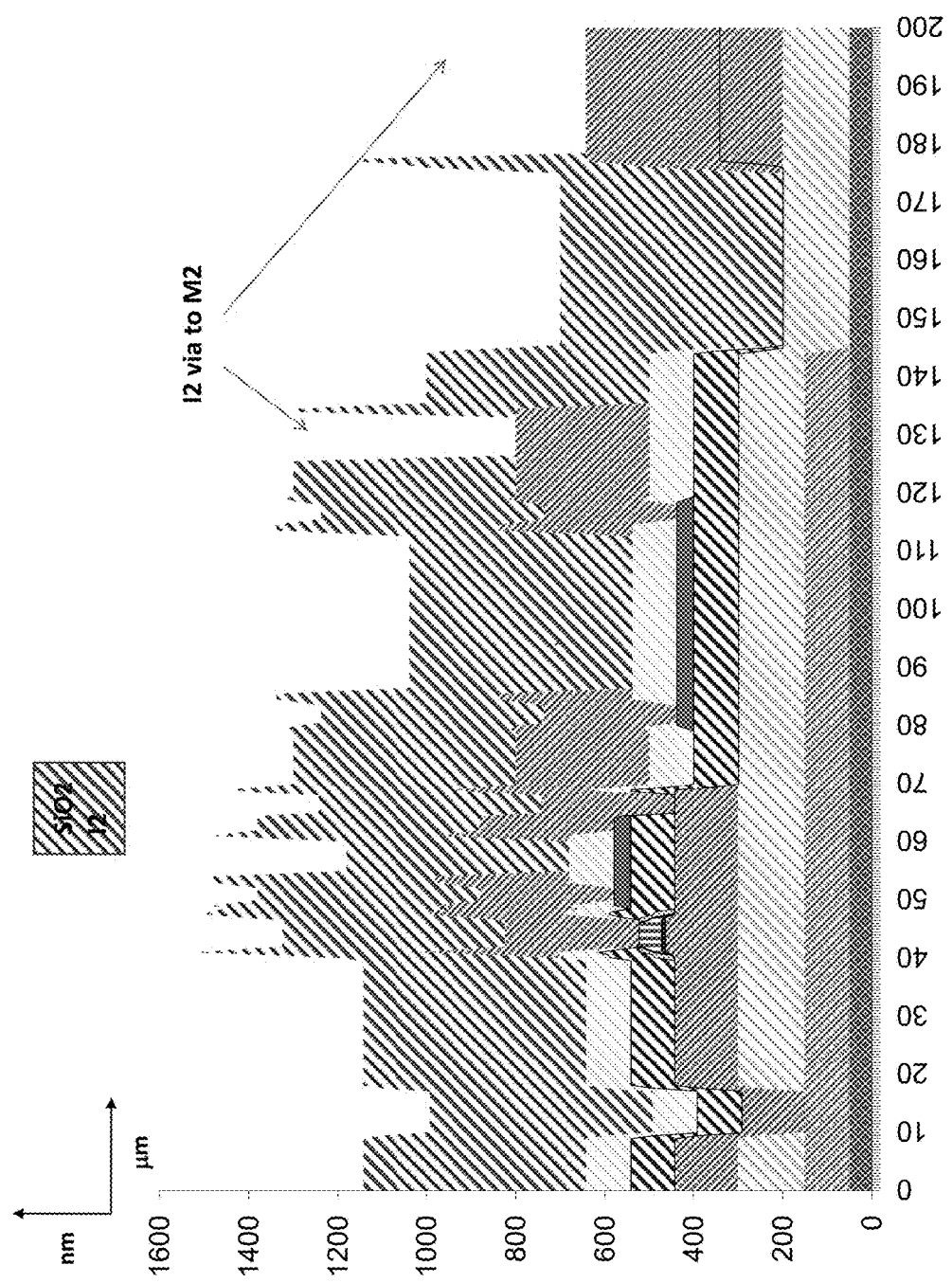
FIG. 9 shows the ninth layer of the Prior Art Hypres Inc. process M2, PECVD deposited, dark field mask lithography defining vias to contact pad and M2 wiring, etched in $CH_4+O_2$ mixture, chemically stripped.

FIG. 9 shows the ninth layer I2—PECVD deposited, dark field mask lithography defining vias to contact pad and M2 wiring, etched in $CH_4+O_2$ mixture, chemically stripped.

The interlayer dielectric between M2 and M3 is PECVD deposited $SiO_2$ insulator of thickness 5000 Å±10% with a specific capacitance of 0.08 $fF/\mu m^2\pm20\%$. Contact to M2 is through I2 vias with a minimum size of 2×2 µm and a bias (0.20±0.25) µm. The alignment tolerance of I2 to M2 is ±0.25 µm.

1.10 M3—Niobium Superconductor Material

Figure 10:
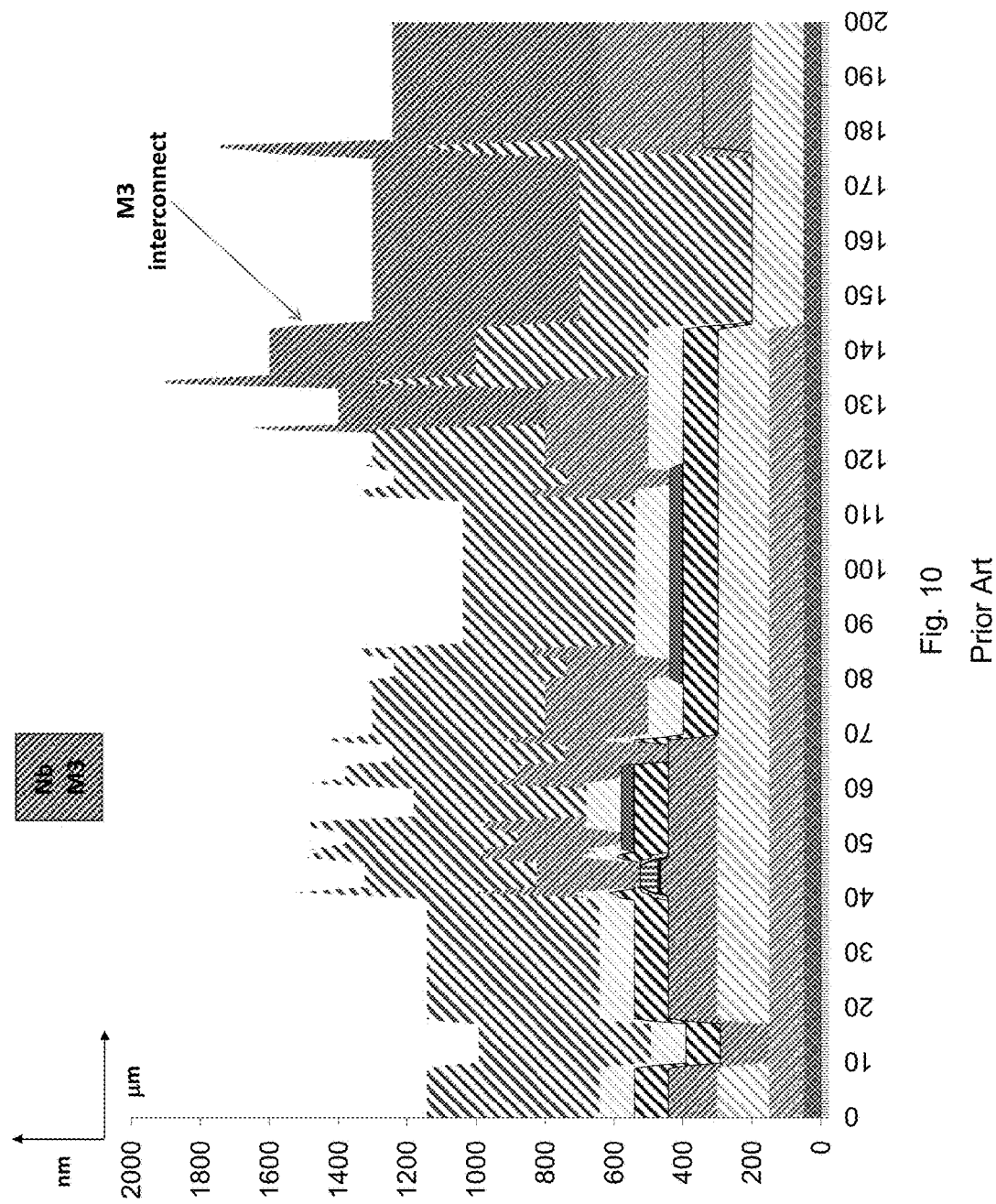
FIG. 10 shows the tenth layer of the Prior Art Hypres Inc. process M3, sputter deposited niobium, clear field mask lithography defining M3 interconnects, $SF_6$ RIE etched, chemically stripped.

FIG. 10 shows the tenth layer—M3, sputter deposited niobium, clear field mask lithography defining M3 interconnects, $SF_6$ RIE etched, chemically stripped.

The Niobium superconductor material layer is deposited by magnetron sputtering in a load locked, cryo-pumped chamber with a base pressure of $1\times10^{-7}$ T. It is grown to a thickness of 6000 Å±10% and the film's sheet resistance at room temperature is $0.60\Omega/\square\pm10\%$. Minimum line width 2 µm and a minimum gap between lines of 2.5 µm and a bias of (−0.75±0.25) µm. The alignment tolerance of M3 to I2 is ±0.5 µm. This layer is mainly used for wiring and as an inductor with M0 as a ground plane. A specific inductance of 1.26±0.02 pH/$\square$ and a fringing factor of 1.9±0.1 µm.

1.11 R3—Titanium/Palladium/Gold (Ti/Pl/Au) Resistor Material

Figure 11:
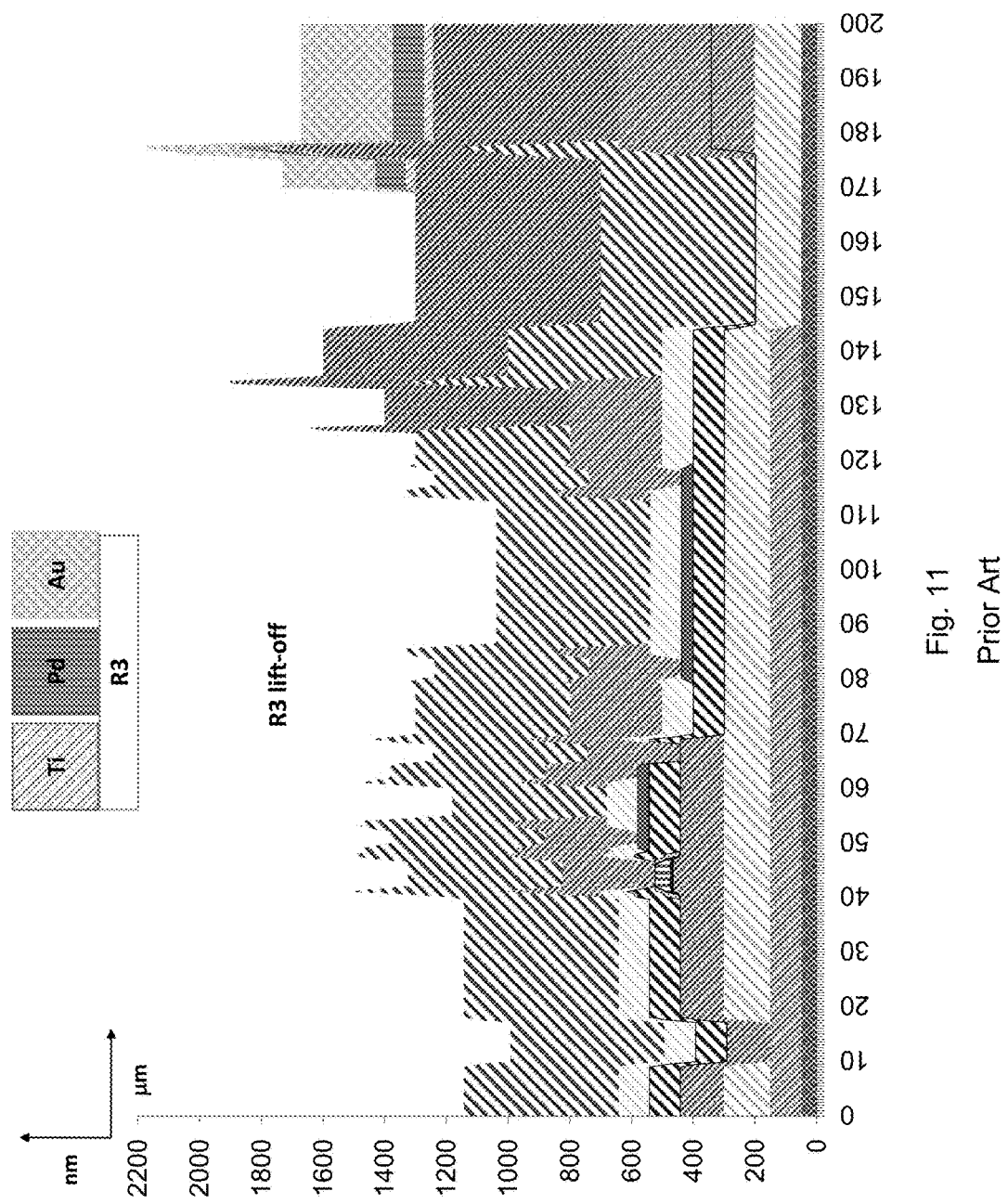
FIG. 11 shows the eleventh layer of the Prior Art Hypres Inc. process R3, Image reversal lithography using clear field mask defining R3, electron beam evaporated Ti/Pl/Au, Lift-off, chemically cleaned.

FIG. 11 shows the eleventh layer—R3, Image reversal lithography using clear field mask defining R3, electron beam evaporated Ti/Pl/Au, Lift-off, chemically cleaned.

The Titanium/Palladium/Gold (Ti/Pl/Au) resistor material is deposited by electron beam evaporation in a cryo-pumped chamber with a base pressure of $1\times10^{-7}$ T. It is grown to a thickness of (300/1000/2000 Å)±10% and the film's sheet resistance at room temperature is $0.23\pm0.05\Omega/\square$ and is reduced to $0.15\pm0.05\Omega/\square$ at 4.2 K. Minimum line width 2 µm. Contact pads are defined in this layer. The alignment tolerance of R3 to M3 is ±0.5 µm.

2 Rapid Planarized Process for Layer Extension (RIPPLE)

The RIPPLE process described below represents one embodiment of the new process for extending prior superconducting fabrication processes.

The Acronym RIPPLE stands for:

Rapid: One deposition and CMP less (~20% less time per layer)

Integrated: to the current standard process, by adding new wiring layers under the ground plane of the old 4-layer Process Planarization Process: Modified "Caldera" process (K. Hinode, et al., Physica C 412-414 (2004) 1437-1441)

Layer

Extension: Easily extendible 4+n, (n=2 has been successfully demonstrated)

All the new superconducting metal layers labeled Mn1, Mn2, Mn3 . . . are placed below the ground plane of the current process—M0. The interconnect between the layers is done through Plugs labeled In1, In2, In3 . . . . The Mnx/Inx duo is deposited at one go with a thin layer of Aluminum separating them. Although Aluminum is not superconducting at 4.2 K, the sub-nanometer thickness renders it superconducting because of the proximity effect. Once the thin film deposition of the now three layers (Mnx—Al—Inx) is done and the both the Plug and superconducting metal layer are defined through a fabrication process that involves: photolithography and reactive ion etch of the Plug; wet chemical or ion beam milling of the Aluminum; photolithography and reactive ion etch of the superconducting metal layer. The respective interlayer dielectric are deposited and partially planarized by photolithography followed by reactive ion etch. By design the photolithography is done in such a way that it leaves a rim of dielectric (20 nm wide) on the perimeter of the superconducting metal and its plug. This insures a uniform dielectric roughness throughout enabling the next process to be pattern independent. The chemical mechanical polishing is thus pattern independent and hence very uniform across the entire wafer. The technology level based on the integration level is now as follows:

1) RIPPLE-0 A process where the M0 ground plane of the legacy process is planarized with 4 superconducting layers.

2) RIPPLE-1 A process where Mn1 to M0 layers are planarized with 5 superconducting metal layers.

3) RIPPLE-2 A process where Mn2 to M0 layers are planarized with 6 superconducting metal layers.

4) RIPPLE-4 A process where Mn4 to M0 layers are planarized with 8 superconducting metal layers.

5) RIPPLE-6 A process where Mn6 to M0 layers are planarized with 10 superconducting metal layers.

Figure 13:
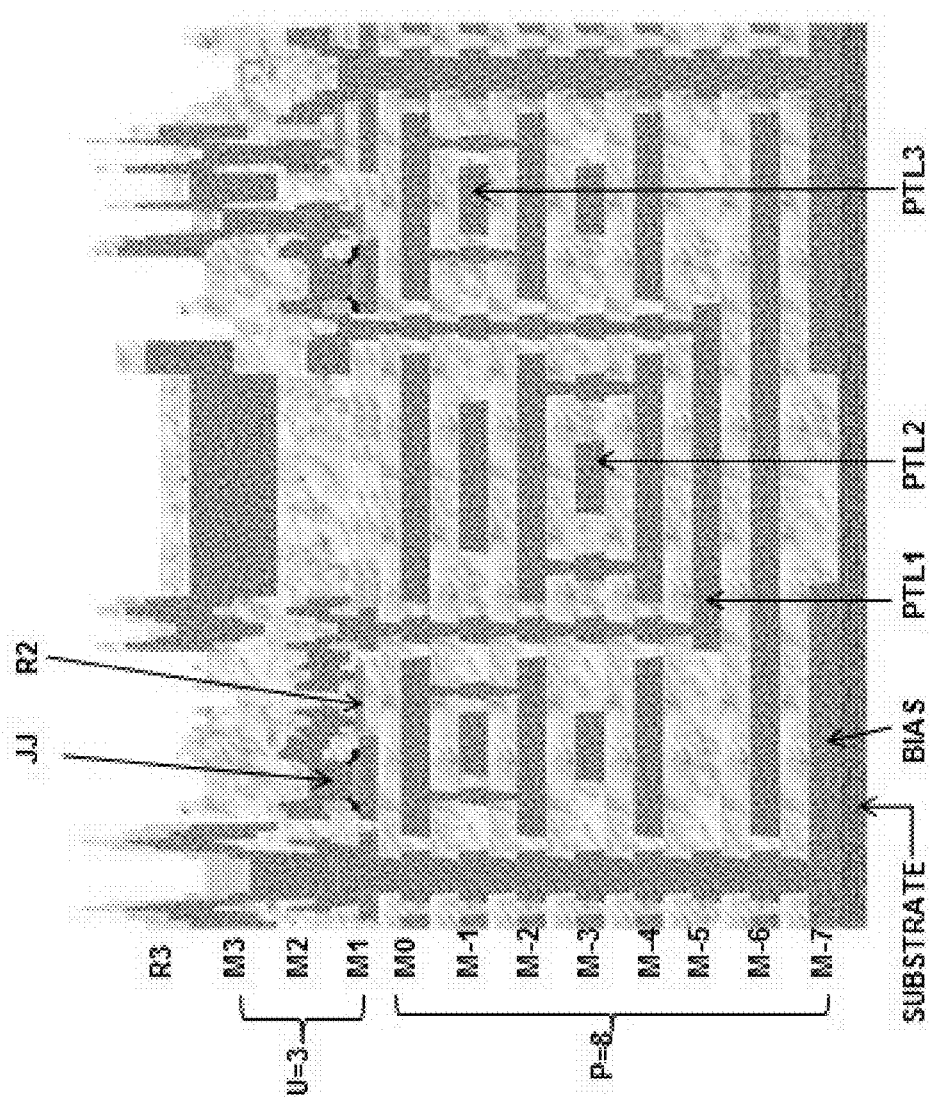
FIG. 13 shows the base technology level description of the RIPPLE-7 process according to the present invention, where Mn8 to M0 layers are planarized.

6) RIPPLE-8 A process where Mn8 to M0 layers are planarized with 12 superconducting metal layers A RIPPLE-7 process where Mn8 to M0 layers are planarized is illustrated in FIG. 13, which shows the base technology level description.

2.1 Advantages of Ripple

1) Rapid: It is estimated that it is 20% faster than a process that would could accomplish similar results by processing one layer at a time, for example CALDERA process. See, Fourie, Coenrad; Xizhu Peng; Takahashi, Akitomo; Yoshikawa, Nobuyuki, "Modeling and calibration of ADP process for inductance calculation with InductEx," Superconductive Electronics Conference (ISEC), 2013 IEEE 14th International, vol., no., pp. 1.3, 7-11 Jul. 2013, doi: 10.1109/ISEC.2013.6604270, expressly incorporated herein by reference. This is because the superconducting wiring layer and the plug that connects it to the subsequent layer are processed in parallel.

2) Easily to implement and increase the integration level of superconducting electronic circuits. All the new layers are "underground layers" with no effect to the layers on the top. They are underground because they go under the M0 layer of the legacy process which is mainly used for grounding.

3) The Chemical Mechanical polishing part of the process has been optimized and made easy to implement by rendering it pattern independent.

4) Easily extendible, Since they same basic process is used to define all the underground layers, as a result it is easy to accommodate designs that require more layers.

5) It can be adopted to define self-aligned Josephson junctions 2.2 Ripple Process Details 2.2.1 Mnx/Inx—Superconducting Metal Layer and Plugs Deposition (Nb—Al—Nb)

This is the first step in increasing the integration level of superconducting electronics circuits. The Niobium-Aluminum-Niobium trilayer is deposited by magnetron sputtering in a load locked, cryo-pumped chamber with a base pressure of $1 \times 10^{-7}$ T. The Niobium metal layer are grown to a thickness of 2000 Å±10% each with a 100 Å±10% Aluminum in between. The film's sheet resistance at room temperature is 0.54Ω/□±10%. Minimum line width 0.8 µm and a minimum gap between lines of 0.5 µm and a bias of (−0.20±0.20) µm. This layer can be used for wiring interconnects, passive transmission lines and inductors.

2.2.1.1 Pattern Inx ("Plugs"), Reactive Ion Etch (Al as an Etch-Stop)

Figure 14A:
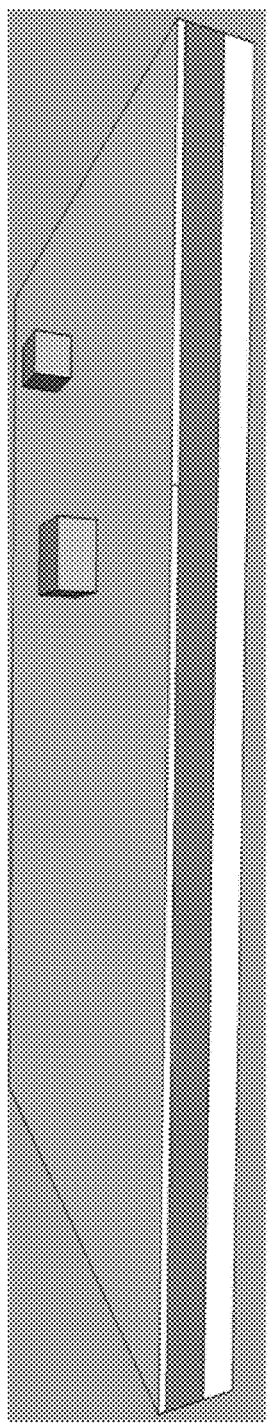
FIGS. 14A and 14B show the xth Superconducting metal layer extension, after plug definition.
Figure 14B:
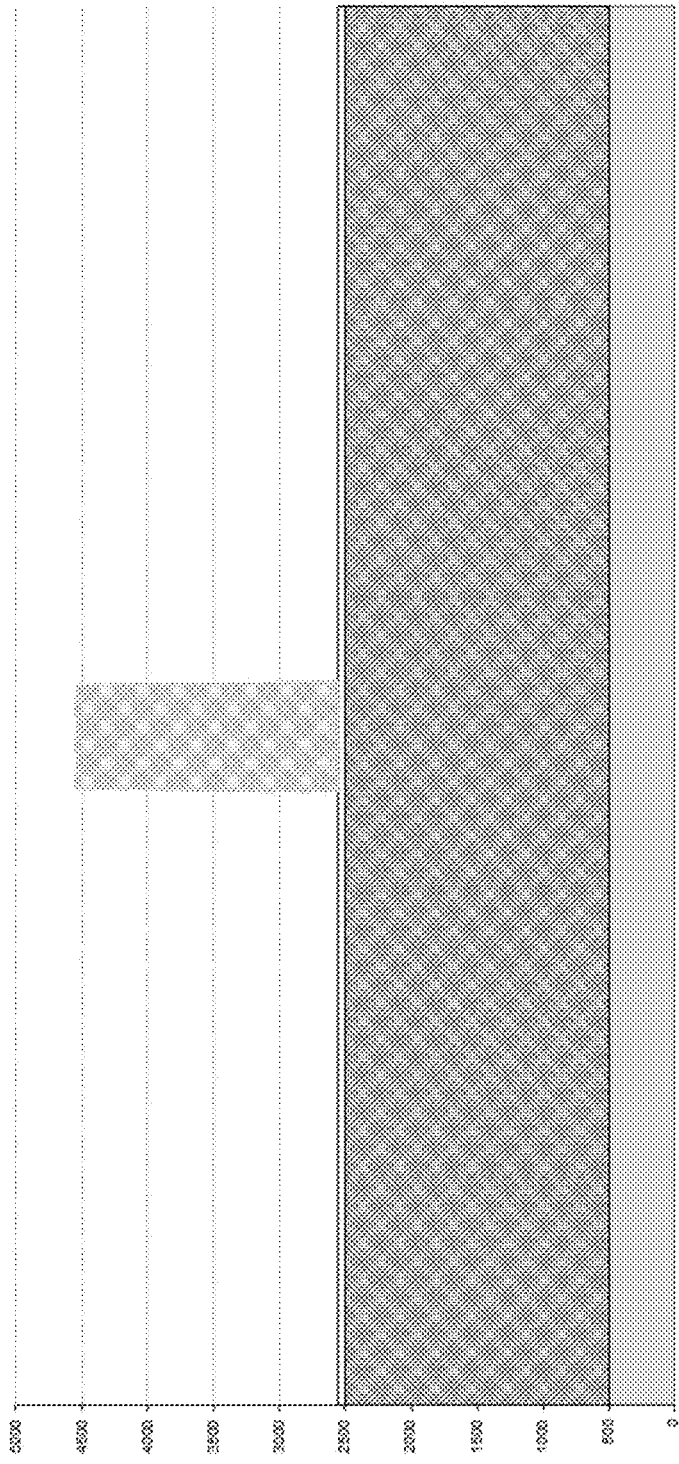

FIGS. 14A and 14B show the $x^{th}$ Superconducting metal layer extension, after the plug definition.

After deposition of the tri-layer, the first step is to pattern the Plug as illustrated in FIG. 14A, which is a 3D aerial view showing two of the defined Plugs, while FIG. 14B is a cross-sectional view zooming into one of the plugs. Etching of metal and dielectric is done in two Reactive Ion Etching (RIE) systems. The first one is an RIE system with fluorine based chemistries ($SF_6$, $CHF_3$, $CF_4$) and the second one is an inductively-coupled plasma (ICP) etch system equipped with both flouring and chlorine-based chemistries ($Cl_2$, $BCl_3$). RIE is a preferred method of etching as it is very anisotropic with high selectivity. For niobium etch the most commonly used are fluorine-based plasmas, e.g., $SF_6$ plasma. The typical etch parameter are an $SF_6$ gas flowing at 20 sccm in a chamber pressurized to 2 Pascal and plasma sustained with an RF power of 45.

2.2.1.2 Al Removal (Wet Etch or Anodization/Mill)

The next step is to remove the aluminum etch stop either by means of wet etch, anodization or milling.

2.2.2 Pattern #2—Mnx, Reactive Ion Etch

Figure 15A:
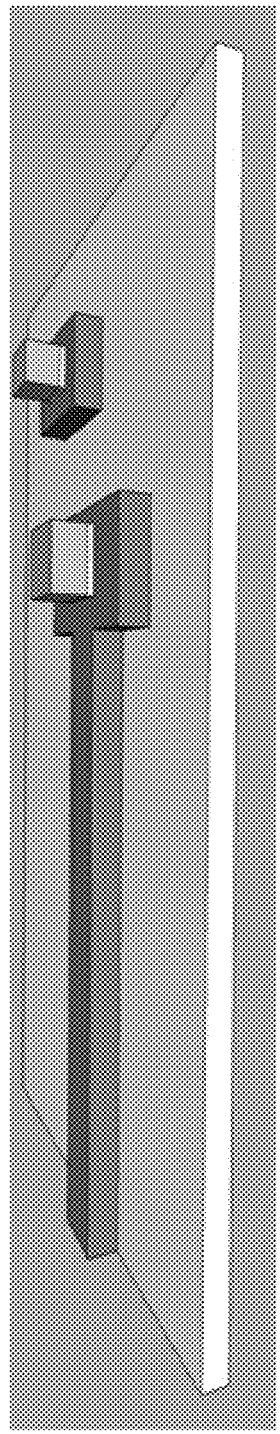
FIGS. 15A and 15B show the Al wet etch, Pattern #2, Niobium metal RIE.
Figure 15B:
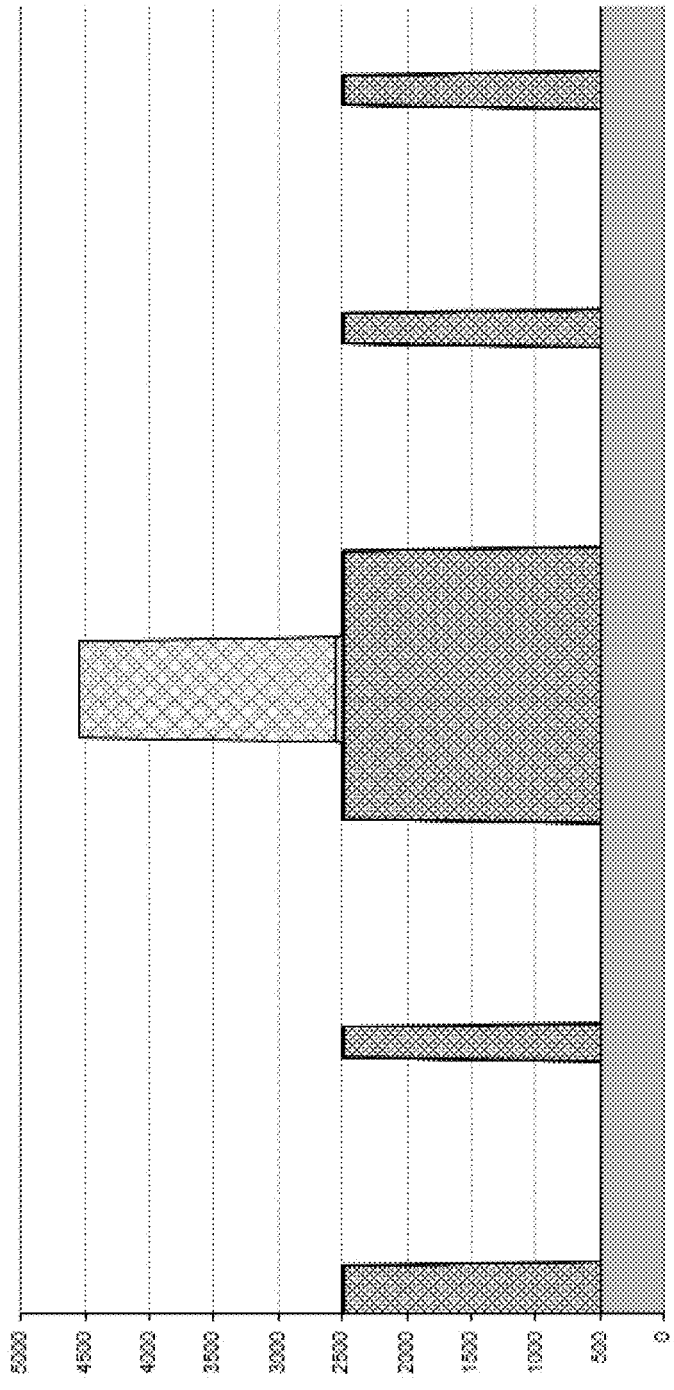

FIGS. 15A and 15B show the Al wet etch, Pattern #2, Niobium metal RIE.

Then photolithography is done to define the Mnx superconducting metal layer, as illustrated in FIG. 15A, shows a 3D aerial view showing two of the defined Mnx metals with their respective plugs while FIG. 15B shows a cross-sectional view. The reactive ion etch is done the same manner as the plug.

2.2.3 First Interlayer Dielectric ($SiO_2$) Deposition (PECVD)

Figure 16A:
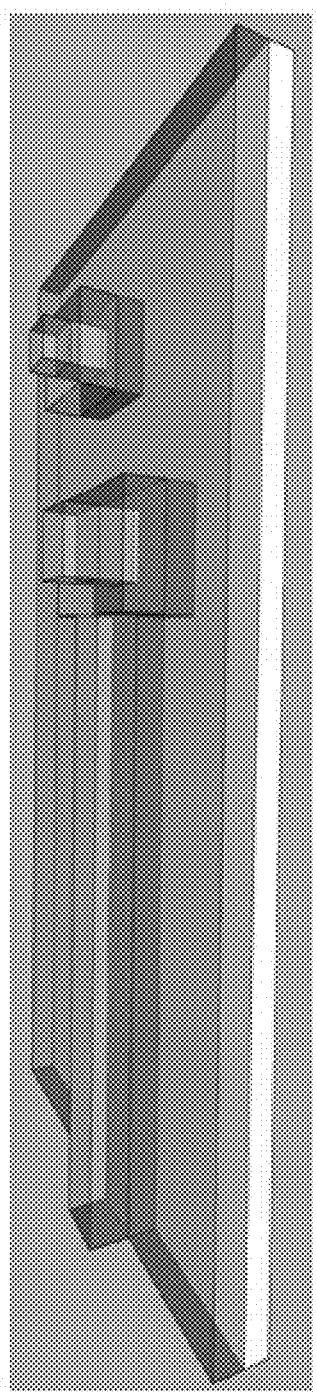
FIGS. 16A and 16B show the First Interlayer dielectric ($SiO_2$) deposition.
Figure 16B:
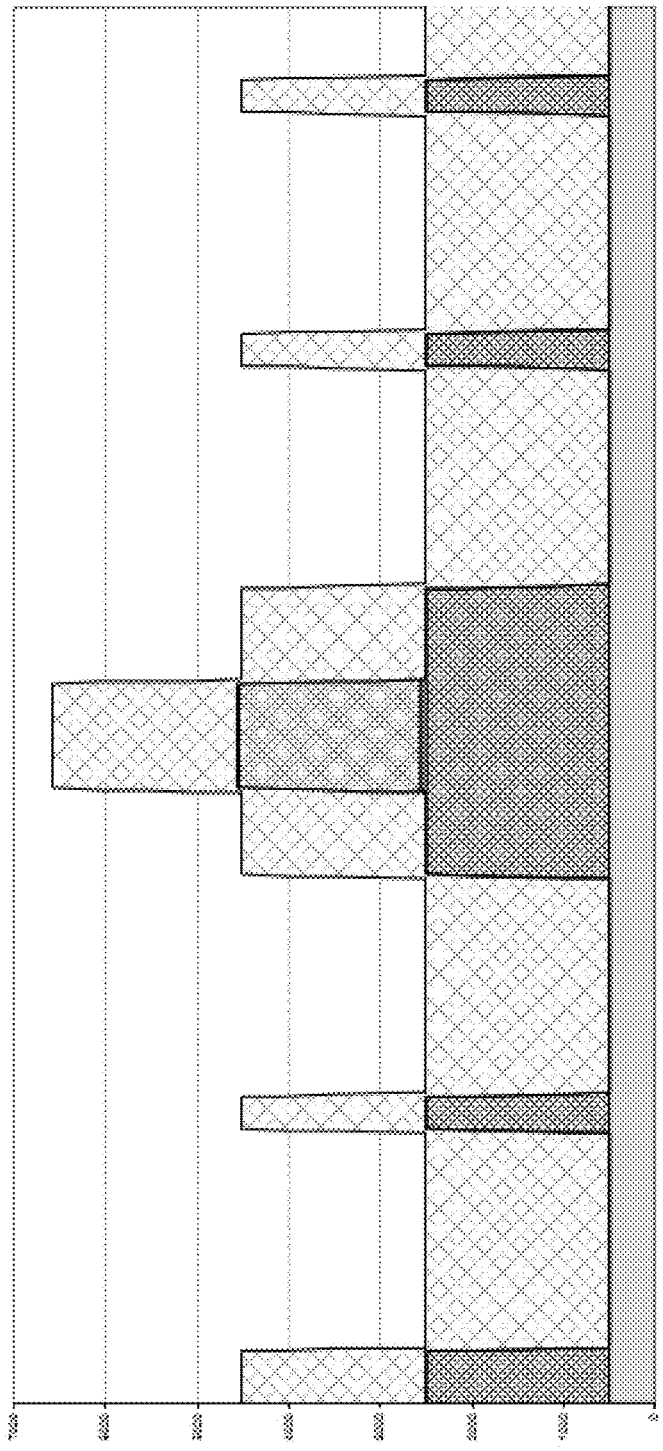

FIGS. 16A and 16B show the First Interlayer dielectric (SiO2) deposition.

Then $SiO_2$ interlayer dielectric is a plasma enhanced chemical vapor deposition (PECVD) layer formed having a thickness equal to Mnx of 2000 Å±10% with a specific capacitance of 0.24 fF/µm²±20%. The resulting profile is illustrated in FIG. 16A.

2.2.3.1 Pattern #2 (with 0.2-µm Bias) $SiO_2$ Planarization (RIE)

Figure 17A:
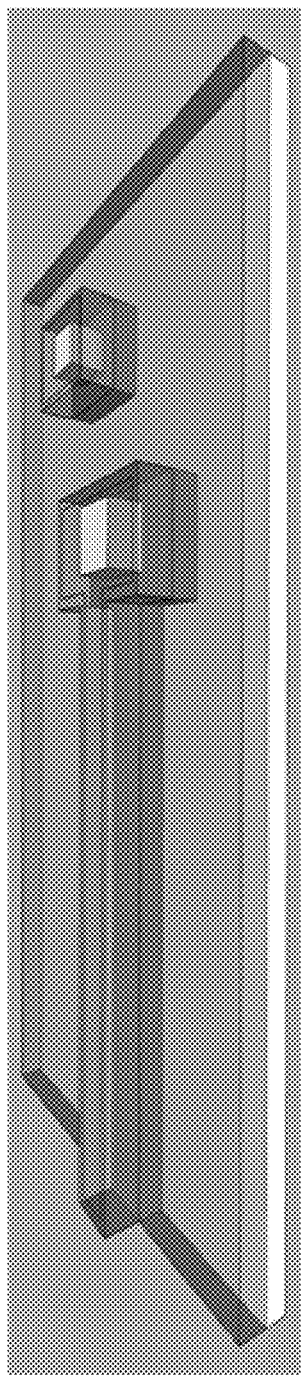
FIGS. 17A and 17B show the removal of Interlayer dielectric by Reactive Ion Etch.
Figure 17B:
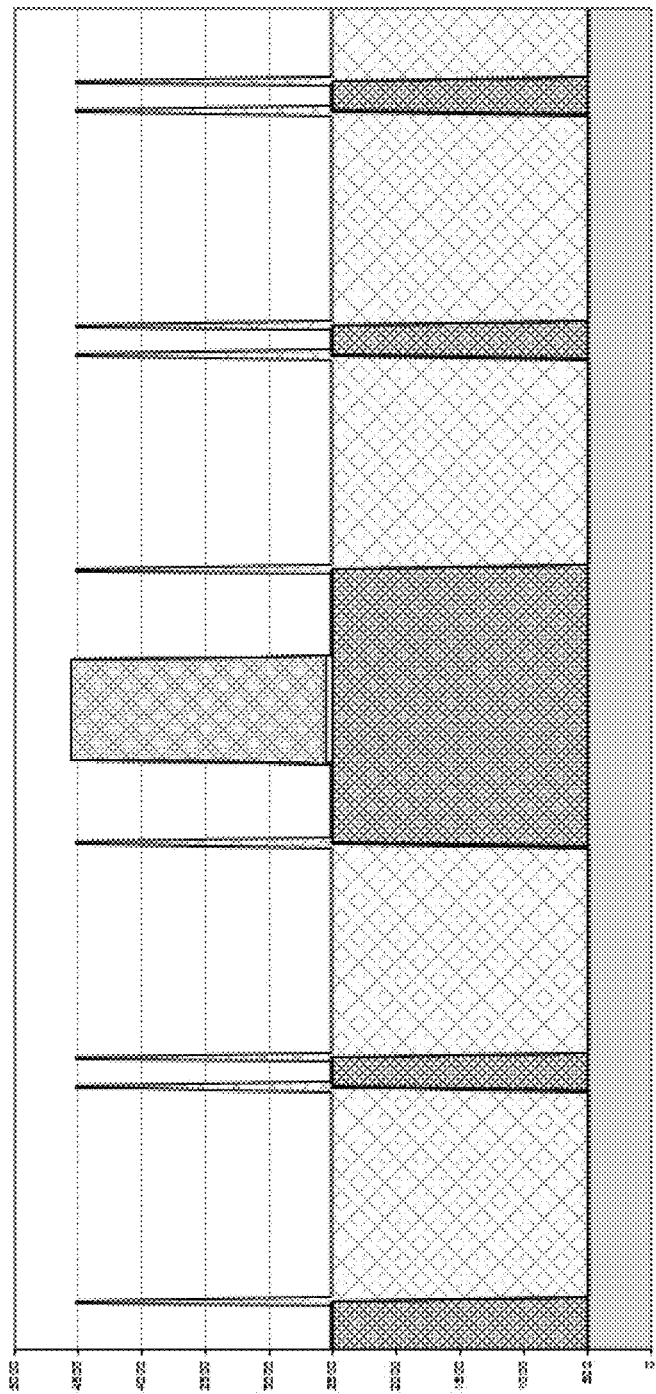

FIGS. 17A and 17B show the removal of Interlayer dielectric by Reactive Ion Etch.

The respective interlayer dielectric are deposited and partially planarized by photolithography followed by reactive ion etch. By design the photolithography is done in such a way that it leaves a rim of dielectric (20 nm wide) on the perimeter of the superconducting metal and its plug. All dielectric layers are etched in a $CHF_3$ and $O_2$ plasma, 8 sccm of $O_2$ and 45 sccm of $CHF_3$ is flown into the chamber held at a pressure of 13.33 Pa. Etching is done at 150 W RF power and the temperature on the back of the wafer is kept controlled by a chiller set to about 11° C. The resulting cross section is shown in FIG. 17A.

2.2.4 $SiO_2$ Deposition (PECVD)

Figure 18A:
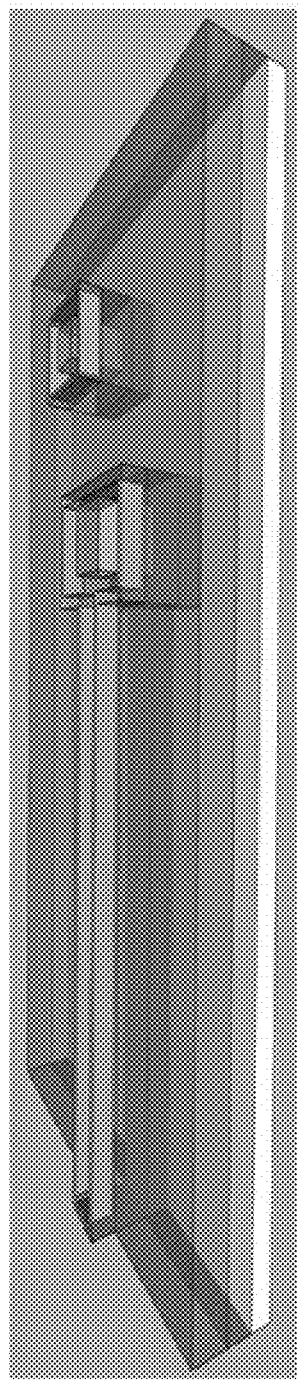
FIGS. 18A and 18B show the Second ILD deposition.
Figure 18B:
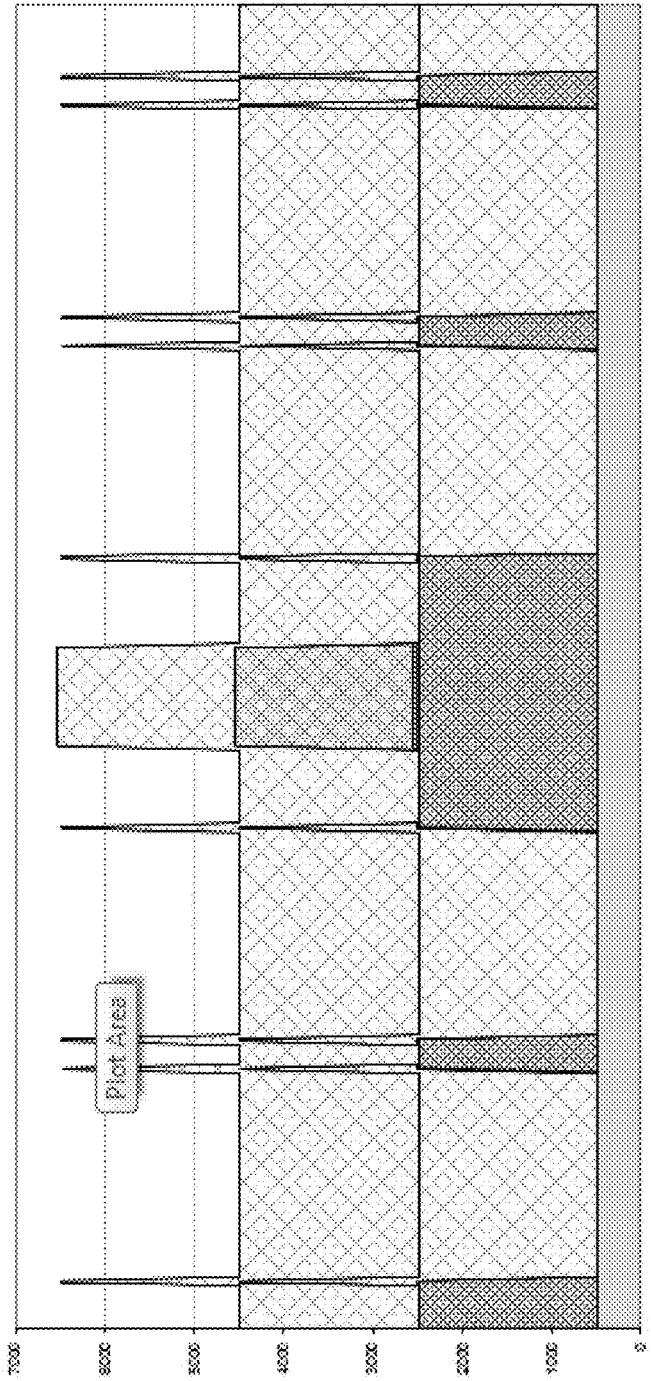

FIGS. 18A and 18B show the Second ILD deposition.

Then $SiO_2$ interlayer dielectric is plasma enhance chemical vapor deposited (PECVD) thickness equal to Inx of 2000 Å±10% with a specific capacitance of 0.24 fF/µm²±20%. The resulting profile is illustrated in FIG. 18A.

2.2.4.1 Pattern #1 (with 0.2-µm Bias), $SiO_2$ Planarization (RIE)

Figure 19A:
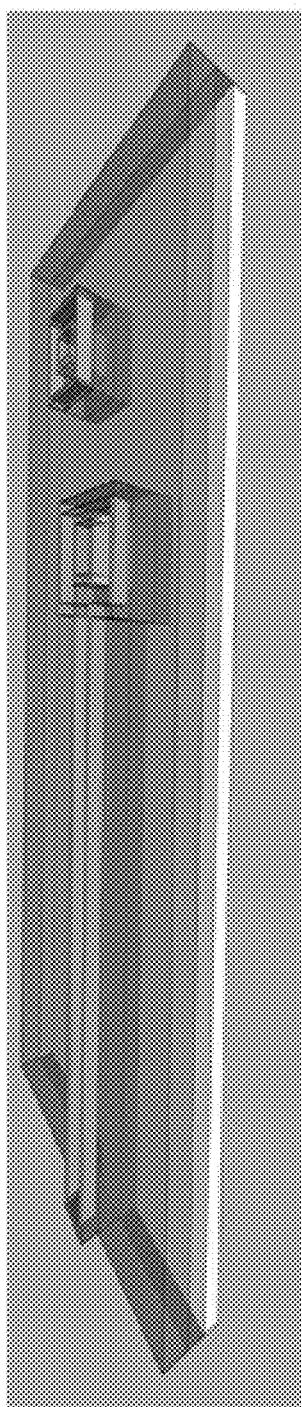
FIGS. 19A and 19B show the ILD Planarization by RIE $SiO_2$ etch.
Figure 19B:
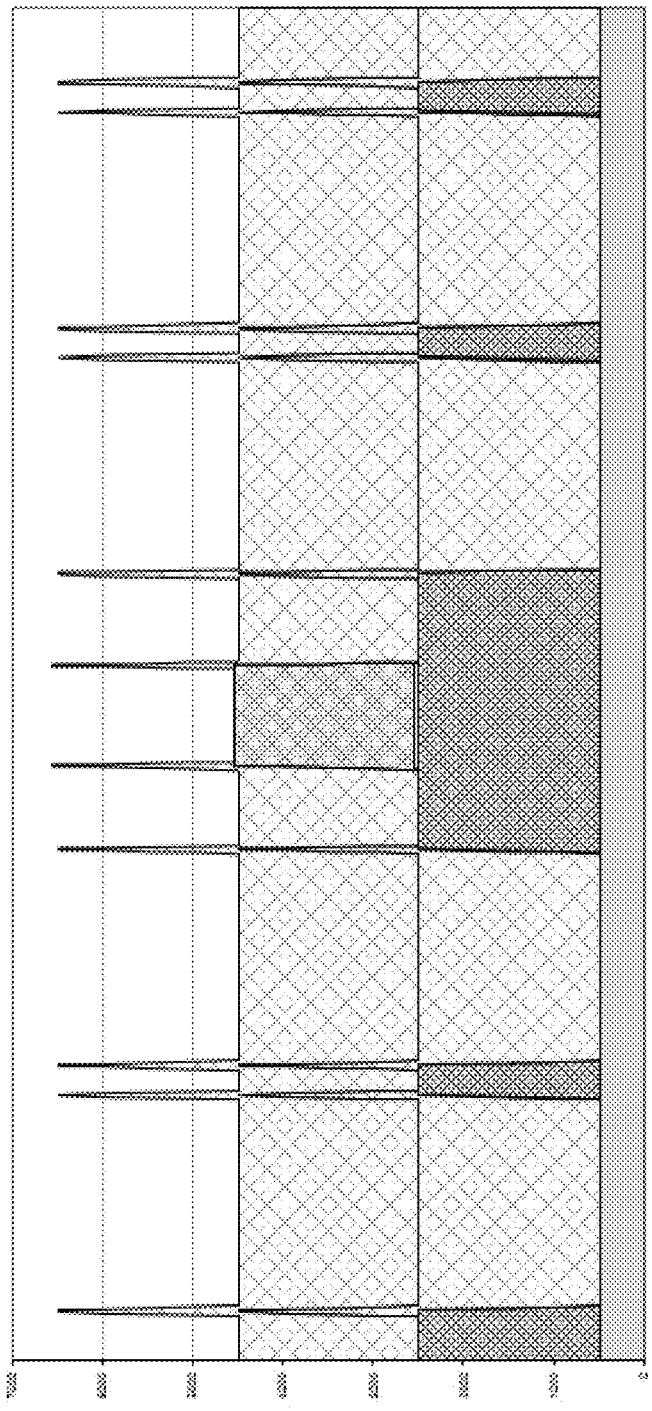

FIGS. 19A and 19B show the ILD (interlayer dielectric) Planarization by RIE $SiO_2$ etch.

Then photolithography is done in the same manner as pattern #1, the reactive ion etch is done in the same manner as the pattern #1, resulting in features illustrated in FIG. 19A, which shows a 3D aerial view with two of the defined Mnx metals and their respective plugs while FIG. 19B shows a cross-sectional view.

2.2.5 SiO$_2$ Planarization (CMP)

Figure 20A:
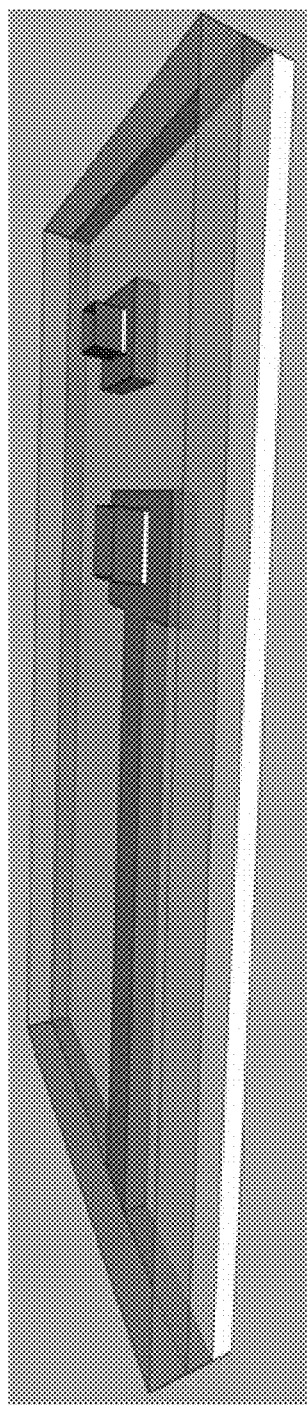
FIGS. 20A and 20B show Chemical Mechanical Planarization.
Figure 20B:
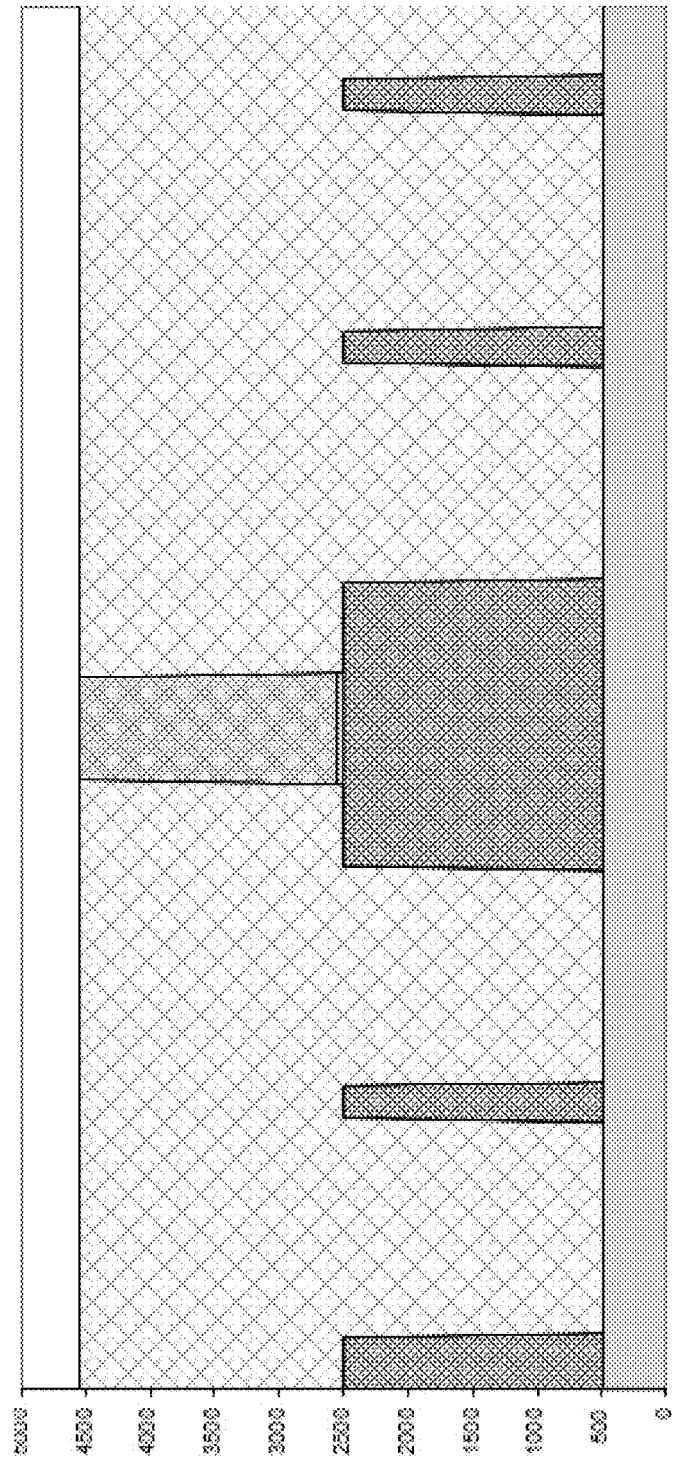

FIGS. 20A and 20B show Chemical Mechanical Polishing Planarization. The final, but not the least step is one that takes care of the residual interlayer dielectric on the perimeter of the metals and the plugs by chemical mechanical polishing, resulting in a structure illustrated in FIGS. 21A and 21B, which w an alternative approach to Chemical Mechanical Polishing Planarization as shown in FIGS. 20A and 20B, of achieving the same planarized metal with a plug, but the only difference being the aluminum layer that is used as an etch stop is not removed instead is anodized and kept as part of the interlayer dielectric.

Figure 22:
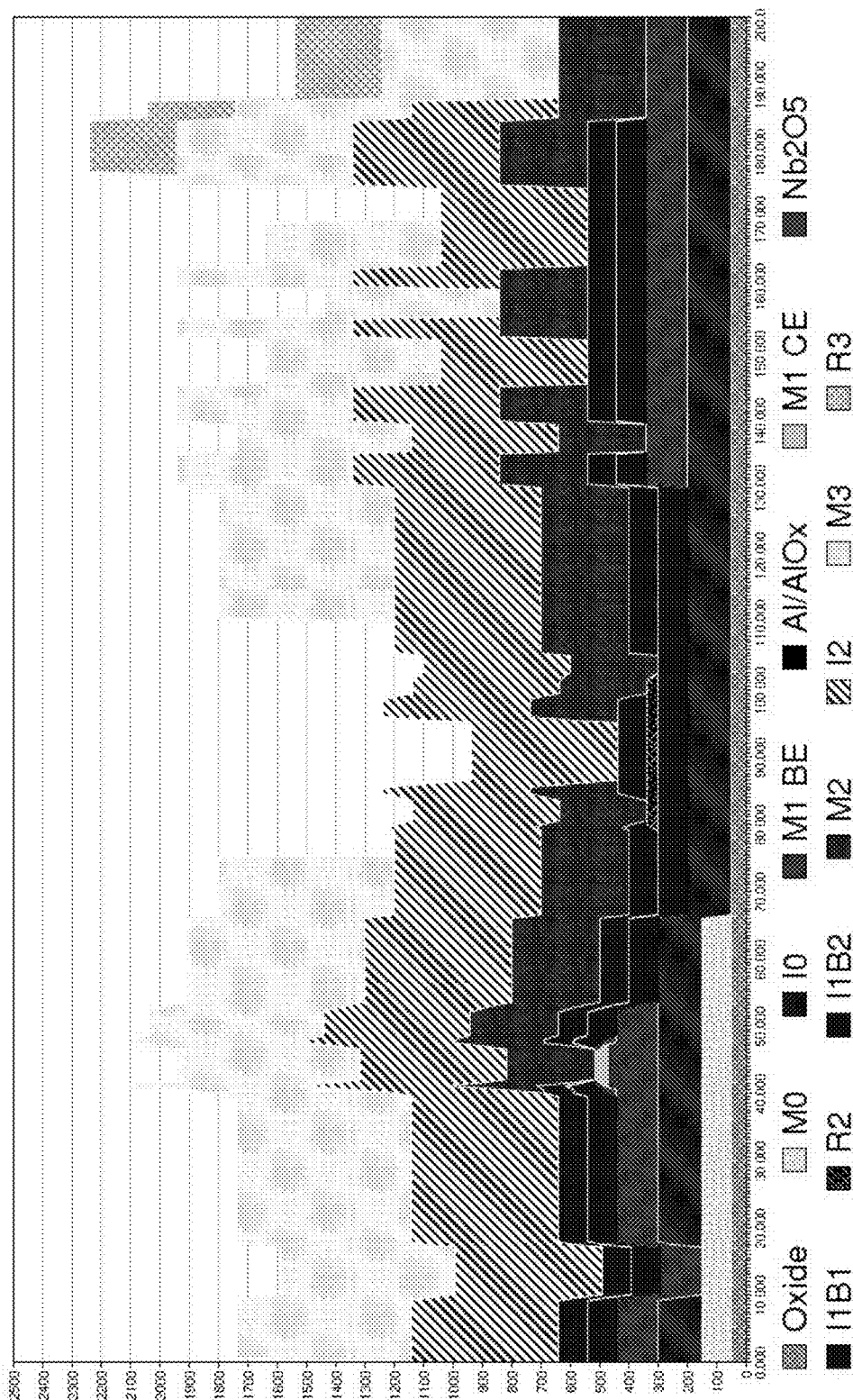
FIG. 22 shows a prior art 4-layer metal process.

FIG. 22 shows a prior art 4-layer metal process, which is not planarized, and thus has a varying topography between each layer.

Figure 23:
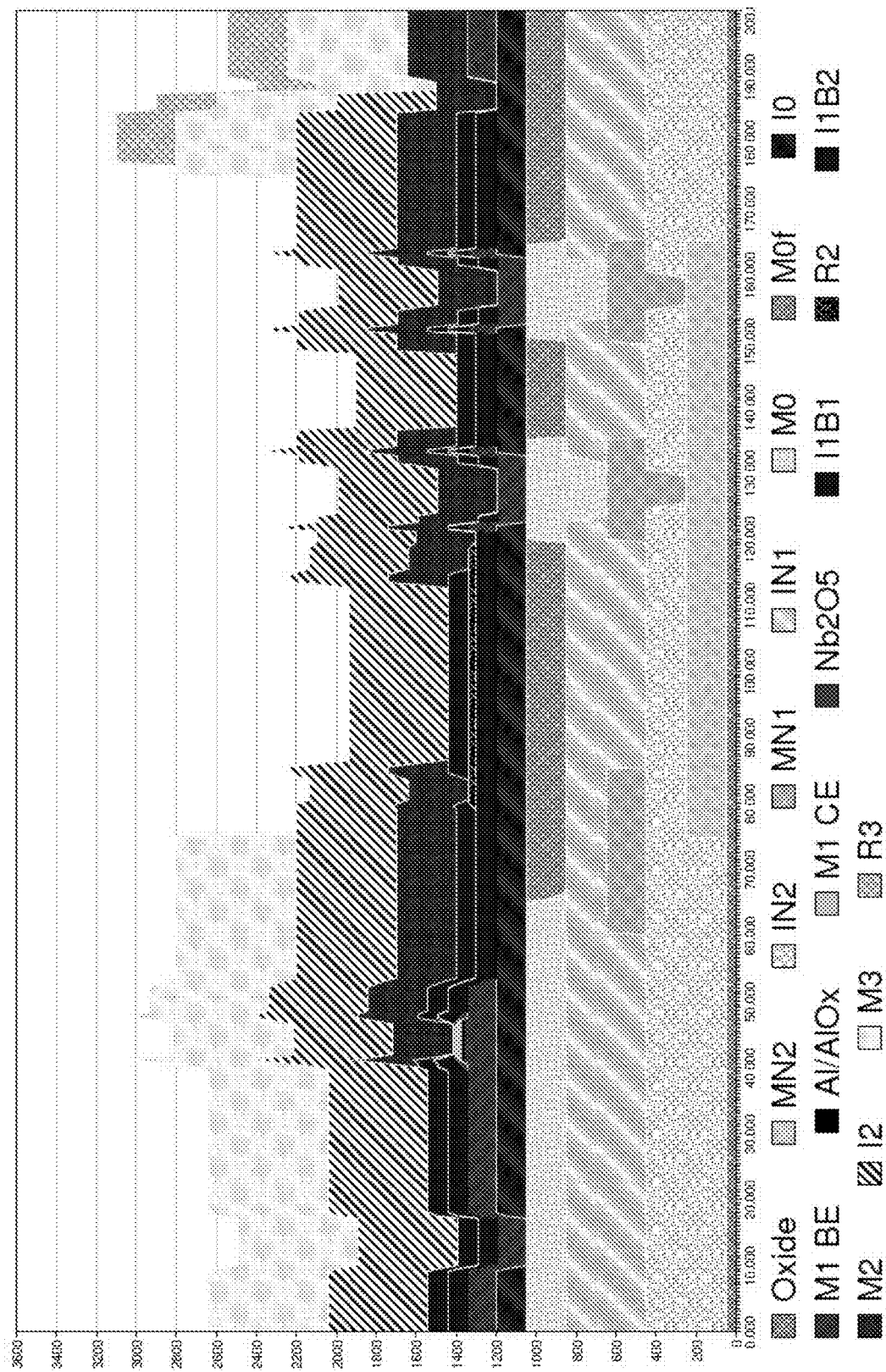
FIG. 23 shows a planarized 6 metal layer process.

FIG. 23 shows a planarized 6 metal layer process, in which lower interconnection layers have planarized topography, while the upper layers above the ground plane (magnetic shielding layer between interconnect layers and Josephson junction trilayer) are non-planar.

Figure 24:
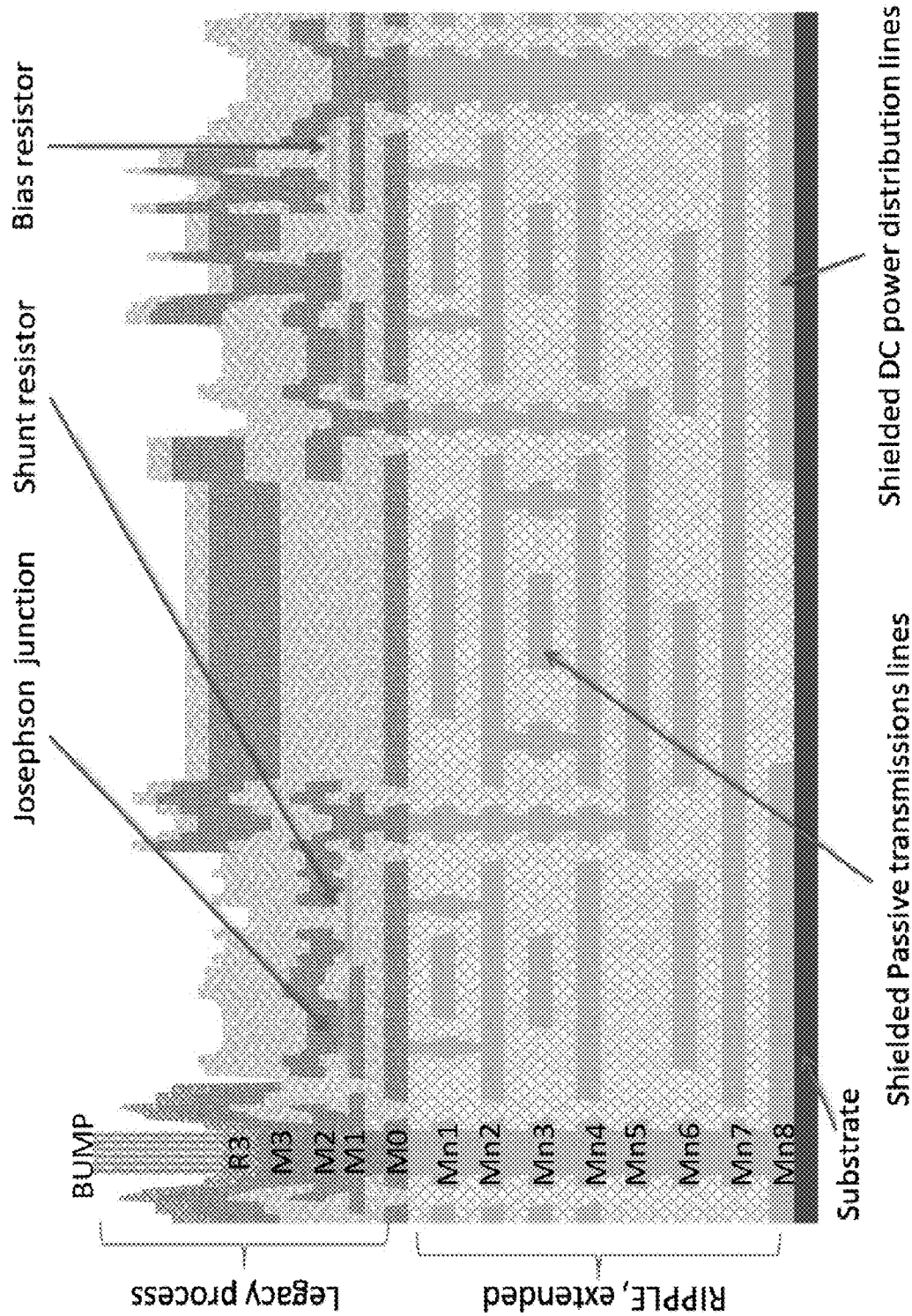
FIG. 24 shows RIPPLE-8, a process with 12 superconducting layers, Shielded passive transmission lines, shielded DC power distributions.

FIG. 24 shows a RIPPLE-8 process integrated circuit device having 12 superconducting layers (8 planarized and 4 non-planarized), shielded passive transmission lines, and shielded DC power distributions below the ground plane, and 4-layer traditional non-planarized active superconducting circuitry above the ground plane.

Figures 25A, 25B:
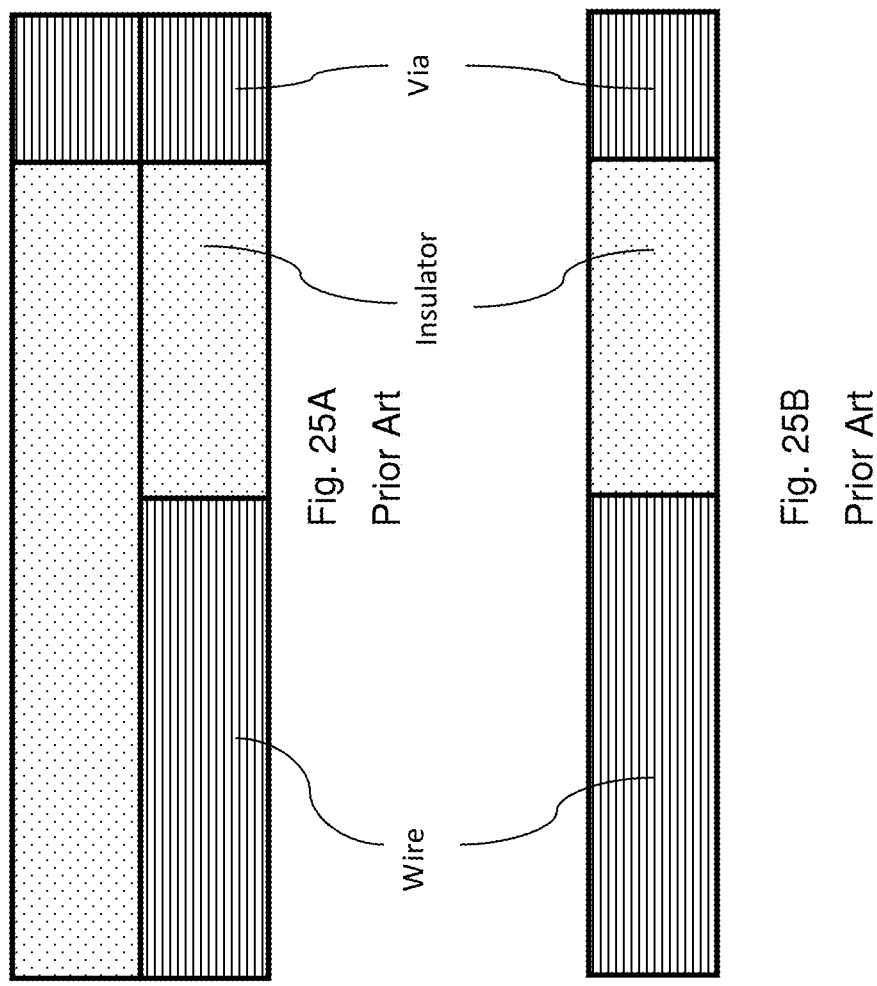
FIGS. 25A and 25B show schematic planarized layers according to the Prior Art.

FIG. 25A shows a simplified picture of a completed planarized conducting layer and insulating overlayer, with the patterned wiring and via labeled. A planarized intermediate structure according to the prior art is shown in FIG. 25B. According to the prior art, two planarization steps (produced by, e.g., CMP) are therefore required to produce FIG. 25A. In contrast, in the RIPPLE process as described, the intermediate structure of FIG. 25B is never present, but a final structure that is functionally equivalent to FIG. 25A is obtained using only a single planarization step (produced by CMP). This corresponds to a fabrication process that is faster and more reliable.

3. Alternative Embodiment of RIPPLE Process

Figure 26A:
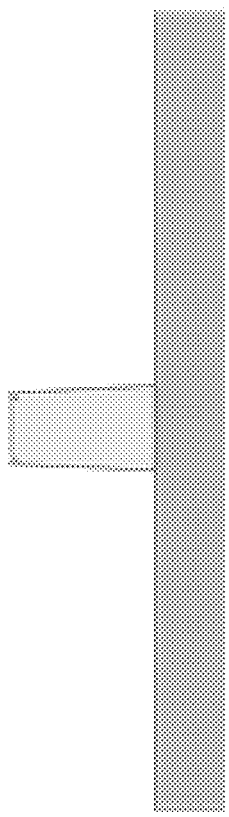
FIGS. 26A, 26B and 26C show via plugs and underground superconducting wire defined without aluminum etch stop; 26A After the definition of the via-plug; 26B After the deposition of the metal layer; and 26C After the definition of the wiring layer.
Figure 26B:
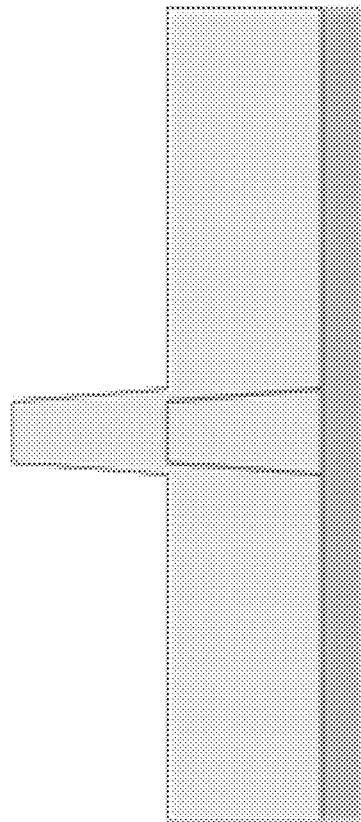
Figure 26C:
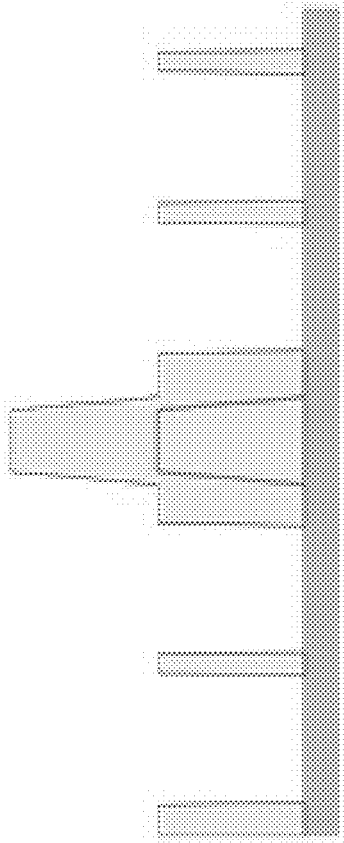

The RIPPLE process above starts with deposition of a Nb/Al/Nb trilayer, where the Al act as an etch stop. This, of course, requires later steps for the removal of this etch stop layer. An alternative embodiment of the process is also presented in FIGS. 26A, 26B, and 26C, without the need for such an etch stop or associated Al removal. The process starts with the deposition of a single 200 nm niobium thin film followed by via plugs patterning and definition (FIG. 26A). The next step is to deposit a second 200-nm thick niobium film by sputtering (FIG. 26B). During this step, the via-plugs will get coated conformally and grow together with the wiring layer. At this stage, the wiring layer is patterned and defined; the resulting structure is shown in FIG. 26C. Then 200 nm silicon dioxide (the same thickness as the wiring layer) is deposited, yielding the same structure as shown in FIGS. 16A and 16B, except for the aluminum. The rest of the process follows the RIPPLE steps described with respect to FIGS. 17-20. In this case also, only a single CMP step is needed for each wiring layer, including the via plug. This alternative embodiment may provide improved reliability and speed by skipping the aluminum etch step.

These are representative examples of the RIPPLE process, and others are also possible. The key is to pattern the vias before the wiring, which requires only a single CMP step for each wiring bi-layer in a process that can be extended to an arbitrary number of such bi-layers with small stacked vias between them.

The above description of illustrated embodiments is not intended to be exhaustive or to limit the embodiments to the precise forms disclosed. Although specific embodiments and examples are described herein for illustrative purposes, various equivalent modifications can be made without departing from the spirit and scope of the disclosure, as will be recognized by those skilled in the relevant art. The teachings provided herein of the various embodiments can be applied to other electronic systems, methods and apparatus, not necessarily the exemplary electronic systems, methods and apparatus generally described above.

As will be apparent to those skilled in the art, the various embodiments described above can be combined to provide further embodiments. Aspects of the present systems, methods and apparatus can be modified, if necessary, to employ systems, methods, apparatus and concepts of the various patents, applications and publications to provide yet further embodiments of the invention. For example, the various systems, methods and apparatus may include a different number of metal or dielectric layers than set out in the illustrated embodiments, such as three or more metal layers and two or more insulating dielectric layers alternating with the metal layers, the layers may be disposed in a different order or area, or the embodiments may omit some elements, and/or employ additional elements.

All of the U.S. patents, U.S. patent application publications, U.S. patent applications, referred to in this specification are incorporated herein by reference, in their entirety and for all purposes. Aspects of the embodiments can be modified, if necessary, to employ systems, circuits and concepts of the various patents, applications and publications to provide yet further embodiments.

These and other changes can be made to the present systems, methods and apparatus in light of the above description. In general, in the following claims, the terms used should not be construed to limit the invention to the specific embodiments disclosed in the specification and the claims, but should be construed to include all possible embodiments along with the full scope of equivalents to which such claims are entitled. Accordingly, the invention is not limited by the disclosure, but instead its scope is to be determined entirely by the following claims.

What is claimed is:

1. A planarized integrated circuit on a substrate, comprising: a series of planarized layers comprising at least two layers, formed successively on the substrate, each respective layer comprising: an electrically conductive via layer, patterned into a set of vias which define a set of vertically extending structures which electrically interconnect with conductive structures of an adjacent layer; an electrically conductive layer, formed by deposition over, and adjacent to, the electrically conductive via layer patterned into the set of vias, the electrically conductive layer-being patterned into a set of wires by removal of portions of the electrically conductive layer surrounding the set of wires, with the set of vertically extending structures extending above the set of wires which do not overly the set of vias; a first insulating layer formed over the electrically conductive via layer and the electrically conductive layer which is etched using an anisotropic etch process, to maintain a nonplanar raised Caldera pattern surrounding edges of the set of wires; and a second insulating layer formed over the set of wires and the set of vias, formed over the first insulating layer having the maintained raised Caldera pattern surrounding edges of the set of wires, to produce a conformal coating, which is etched using an anisotropic etch process, to maintain conformally coated raised Caldera pattern surrounding edges of the set of wires, and raised Caldera pattern surrounding edges of the set of vias, the second insulating layer being planarized to expose upper portions of the set of vertically extending structures, and remove the conformally coated raised Caldera pattern surrounding edges of the set of wires and the raised Caldera pattern surrounding edges of the set of vias, wherein the conformally coated raised Caldera pattern is independent of the set of vertically extending structures, wherein the electrically conductive layer, electrically conductive via layer, first insulating layer and second planarized insulating layer being formed as a four layer stack which is planarized once, such that upper portions of the set of vertically extending structures are exposed through the planarized second insulating layer, and wherein the electrically conductive via layer of a respective planarized layer is formed over exposed upper portions of the set of vertically extending structures of a respectively lower planarized layer.

2. The integrated circuit of claim 1, wherein at least one of the electrically conductive layer and the electrically conductive via layer comprises a niobium-based superconductive material.

3. The integrated circuit of claim 1, wherein the insulating layer comprises silicon dioxide.

4. The integrated circuit of claim 1, further comprising at least one non-planarized circuit layer lying above at least one planarized layer.

5. The integrated circuit of claim 1, further comprising at least one Josephson junction formed within a planarized layer, electrically connected to the set of wires.

6. The integrated circuit of claim 1, further comprising a single-flux-quantum circuit formed having a Josephson junction within a planarized layer, electrically connected to the set of wires.

7. The integrated circuit of claim 1, wherein a minimum transverse dimension of a conductive wire is less than 1 micron.

8. The integrated circuit of claim 1, wherein at least one conductive layer comprises a ground plane.

9. The superconducting integrated circuit of claim 1, wherein at least 10 planarized layers are present.

10. The planarized integrated circuit of claim 1, wherein the raised Caldera pattern surrounding edges of the set of vias is formed by a complementary-to-the-metal-mask pattern mask biased for misalignment compensation, and reactive ion etching.

11. The planarized integrated circuit of claim 10, wherein the electrically conductive layer and the electrically conductive via layer are each formed of a cryogenically superconductive material.

12. A planarized integrated circuit on a substrate, comprising a series of successive planarized sets of layers, at least one planarized set of layers comprising: an electrically conductive via layer patterned into a set of vias having via edges, formed on a planar surface; a patterned electrically conductive layer formed into a set of wires having wire edges, superposed on the patterned electrically conductive via layer, wherein portions where the set of wires which coincide in a plane of the planarized set of layers with the set of vias, define vertically extending conductive structures configured to provide a conductive path between the set of wires of the respective layer and a set of wires of an adjacent layer; a first insulating sublayer conformally surrounding the set of wires and the set of vias, which is anisotropically etched to produce a raised pattern having first protrusions corresponding to the wire edges; and a second insulating sublayer, deposited over the first insulating sublayer, having a raised pattern comprising second protrusions corresponding to the first protrusions, and the set of vias, which is anisotropically etched to produce a modified raised pattern having third protrusions corresponding to the via edges, and the second protrusions, the second insulating sublayer being planarized after the anisotropic etch, such that portions of the vertically extending structures are exposed at an upper surface of the planarized second insulating sublayer, and edges of the planarized second insulating sublayer around the exposed portions of the vertically extending structures, comprise planarized Caldera edges, and portions of the set of wires not superposed on the set of vias are covered by the first insulating sublayer and the second insulating sublayer.

13. The planarized integrated circuit of claim 12, wherein the electrically conductive via layer of a subsequent planarized set of layers is disposed on a planarized surface of a respective planarized second insulating sublayer of a preceding set of layers, formed by plasma-enhanced, chemical vapor deposition, in electrical contact with the exposed portions of the vertically extending structures of the preceding planarized set of layers.

14. The planarized integrated circuit of claim 12, wherein the planarized second insulating sublayer has a chemical-mechanical polishing planarized surface.

15. The planarized integrated circuit of claim 12, comprising at least 8 successive planarized sets of layers.

16. The planarized integrated circuit of claim 12, wherein at least one of the electrically conductive layer, and the electrically conductive via layer is a sputtered layer.

17. The planarized integrated circuit of claim 12, wherein at least one of the electrically conductive layer and the electrically conductive via layer has a reactive ion etching-formed pattern.

18. The planarized integrated circuit of claim 12, further comprising at least one Josephson junction formed within a planarized set of layers, electrically connected to the set of wires.

19. The planarized integrated circuit of claim 12, wherein the raised pattern having first protrusions is formed by a complementary-to-the-metal-mask pattern mask biased for misalignment compensation, and reactive ion etching.

20. The planarized integrated circuit of claim 19, wherein the electrically conductive layer and the electrically conductive via layer are each formed of a cryogenically superconductive material, without any intervening layer.

21. A planarized integrated circuit having a substrate, comprising at least one planarized layer formed on the substrate, the at least one planarized layer comprising: at least two layers of cryogenically superconductive material formed on a planar surface, comprising a wiring layer patterned to provide lateral conductive pathways in a plane of a respective layer, and a via layer patterned to provide vertically conductive pathways to an overlying layer, wherein the via layer of a respective planarized layer is patterned prior to superposition of the wiring layer of the respective planarized layer, such that a respective via of the respective planarized layer comprises a stack of the electrically conductive via layer and the superposed electrically conductive layer having a height above a surrounding portion of the wiring layer; and an insulating layer formed over the at least two layers of cryogenically superconductive material, comprising a first non-planarized, anisotropically etched, insulating sublayer covering the wiring layer and having a pattern of vertical protrusions corresponding to edges of the wiring layer, and a second anisotropically etched planarized insulating sublayer formed over the first non-planarized insulating layer, which is planarized to expose an upper portion of the stacks of electrically conductive via layer and the electrically conductive layer, and wherein an edge of the insulating layer surrounding the exposed upper portion of the stacks of electrically conductive via layer comprise planarized Caldera edges.

22. The planarized integrated circuit according to claim 21, wherein the electrically conductive via layer and the electrically conductive layer are each formed of a cryogenically superconducting material, without any layer therebetween, the integrated circuit further comprising a least two Josephson junctions electrically communicating through at least one wiring layer.

23. The planarized integrated circuit of claim 21, comprising at least 8 successive planarized layers.

* * * * *